(12) United States Patent
Jiang et al.

(10) Patent No.: US 11,056,312 B1
(45) Date of Patent: Jul. 6, 2021

(54) MICRO STIGMATOR ARRAY FOR MULTI ELECTRON BEAM SYSTEM

(71) Applicant: KLA Corporation, Milpitas, CA (US)

(72) Inventors: Xinrong Jiang, Palo Alto, CA (US); Christopher Sears, Fremont, CA (US)

(73) Assignee: KLA Corporation, Milpitas, CA (US)

(*) Notice: Subject to any disclaimer, the term of this patent is extended or adjusted under 35 U.S.C. 154(b) by 0 days.

(21) Appl. No.: 16/782,273

(22) Filed: Feb. 5, 2020

(51) Int. Cl.
*H01J 37/153* (2006.01)
*H01J 37/10* (2006.01)

(52) U.S. Cl.
CPC ............ *H01J 37/153* (2013.01); *H01J 37/10* (2013.01); *H01J 2237/121* (2013.01); *H01J 2237/1205* (2013.01); *H01J 2237/1534* (2013.01)

(58) Field of Classification Search
CPC .. H01J 37/153; H01J 37/10; H01J 2237/1205; H01J 2237/121; H01J 2237/1534
See application file for complete search history.

(56) References Cited

U.S. PATENT DOCUMENTS

| 6,246,058 | B1 | 6/2001 | Tiemeijer |
| 10,056,224 | B2 | 8/2018 | Jiang et al. |
| 2003/0209676 | A1 | 11/2003 | Loschner et al. |
| 2006/0145087 | A1 | 7/2006 | Parker |
| 2018/0068825 | A1 | 3/2018 | Brodie |
| 2019/0279842 | A1 | 9/2019 | Ren et al. |
| 2019/0341222 | A1 | 11/2019 | Hu et al. |
| 2019/0355545 | A1 | 11/2019 | Zeidler et al. |

FOREIGN PATENT DOCUMENTS

| KR | 20180018483 A | 2/2018 |
| KR | 1020190041016 A | 4/2019 |
| WO | 2018160688 A1 | 9/2018 |
| WO | 2019068666 A1 | 4/2019 |

OTHER PUBLICATIONS

PCT International Search Report and Written Opinion for International Application No. PCT/US2021/016271 dated May 26, 2021, 7 pages.

*Primary Examiner* — Nicole M Ippolito
*Assistant Examiner* — Hanway Chang
(74) *Attorney, Agent, or Firm* — Suiter Swantz pc llo

(57) ABSTRACT

A system is disclosed. In embodiments, the system includes an electron source and a micro-lens array (MLA) configured to receive one or more primary electron beams from the electron source and split the one or more primary electron beams into a plurality of primary electron beamlets. In embodiments, the system further includes a micro-stigmator array (MSA) including a plurality of dodecapole electrostatic stigmators, wherein the MSA is configured to eliminate at least one of fourth-order focusing aberrations or sixth-order focusing aberrations of the plurality of primary electron beamlets. In embodiments, the system further includes projection optics configured to receive the plurality of primary electron beamlets and focus the plurality of primary electron beamlets onto a surface of a sample.

30 Claims, 17 Drawing Sheets

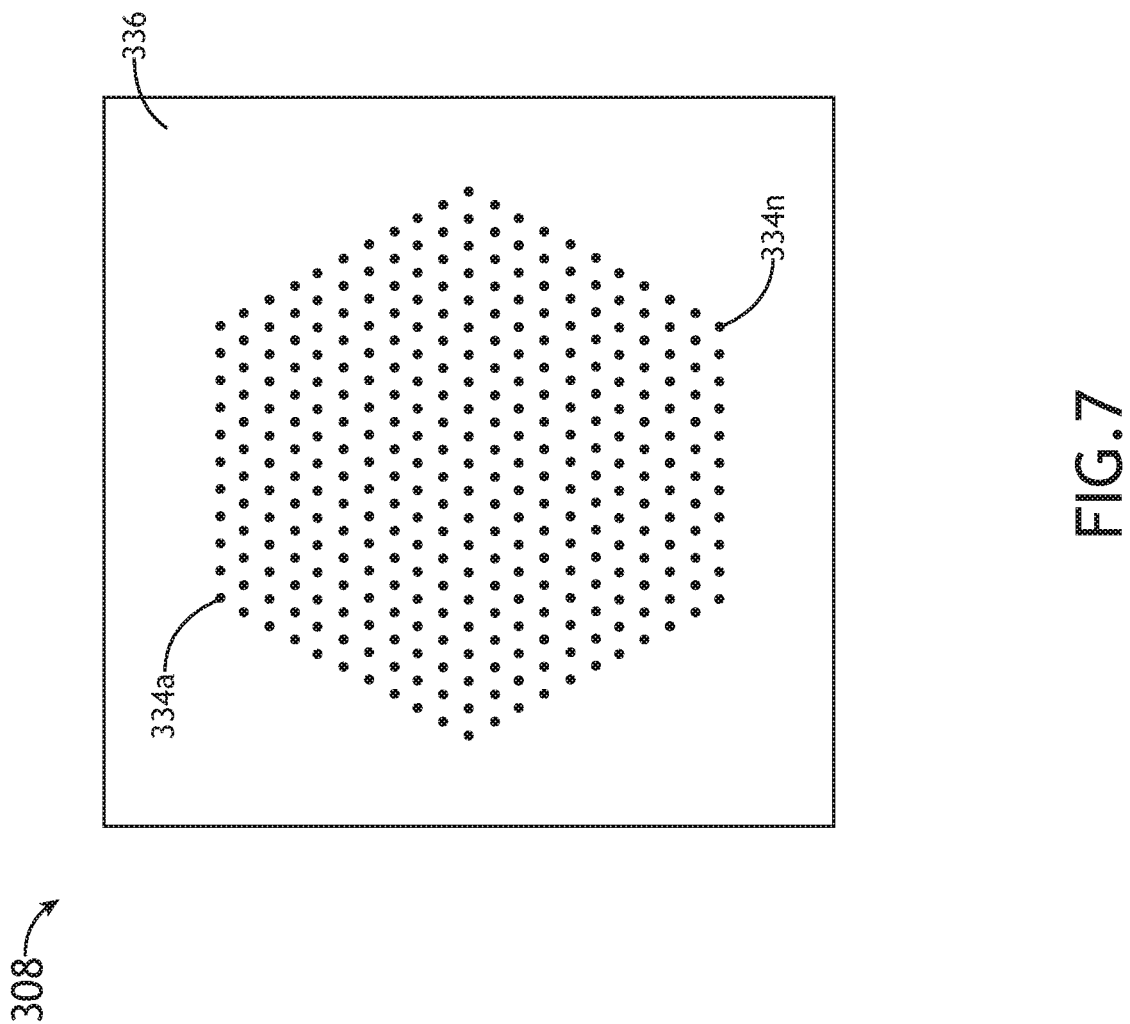

US 11,056,312 B1

MICRO STIGMATOR ARRAY FOR MULTI ELECTRON BEAM SYSTEM

TECHNICAL FIELD

The present invention generally relates to an electron beam system and, more particularly, to a micro-stigmator array (MSA) for a multi-electron beam system.

BACKGROUND

Electron beam inspection systems often utilize a micro-lens array (MLA) in order to split primary electron beams into multiple primary electron beamlets. Due to the large field of view (FOV) of multi-electron beam systems and mechanical tolerances of each micro-lens, astigmatisms within each electron beamlet are inevitable. Larger FOVs result in larger astigmatism aberrations. These focusing aberrations (e.g., fourth-order focusing aberrations, sixth-order focusing aberrations) must be corrected and/or eliminated in order to enable efficient inspection performance. Micro-stigmator arrays (MSA) are one technique which have been incorporated within MLAs in order to correct and/or remove astigmatism aberrations within multi-electron beam systems. Conventional multi-electron beam systems have utilized quadrupole electrostatic stigmators in order to eliminate aberrations within each electron beamlet. However, conventional quadrupole electrostatic stigmators are unable to completely eliminate fourth-order and/or sixth-order focusing aberrations, thereby generating strong octupole (forth-order) and dodecapole (sixth-order) electrostatic fields. Therefore, it would be desirable to provide a system and method that cure one or more of the shortfalls of the previous approaches identified above.

SUMMARY

A system is disclosed. In embodiments, the system includes an electron source and a micro-lens array (MLA) configured to receive one or more primary electron beams from the electron source and split the one or more primary electron beams into a plurality of primary electron beamlets. In embodiments, the system further includes a micro-stigmator array (MSA) including a plurality of dodecapole electrostatic stigmators, wherein the MSA is configured to eliminate at least one of fourth-order focusing aberrations or sixth-order focusing aberrations of the plurality of primary electron beamlets. In embodiments, the system further includes projection optics configured to receive the plurality of primary electron beamlets and focus the plurality of primary electron beamlets onto a surface of a sample.

A micro-stigmator array (MSA) is disclosed. In embodiments, the MSA includes an insulator substrate and a plurality of electrostatic stigmators disposed on the insulator substrate. The plurality of electrostatic stigmators may be configured to receive a plurality of primary electron beamlets and eliminate at least one of fourth-order focusing aberrations or sixth-order focusing aberrations of the plurality of primary electron beamlets. In embodiments, the MSA further includes a plurality of voltage connecting lines disposed on the insulator substrate configured to electrically couple the plurality of electrostatic stigmators to one or more voltage sources via a plurality of connecting pins, wherein the one or more voltage sources are configured to apply one or more focusing voltages to each electrostatic stigmator of the plurality of electrostatic stigmators.

A dodecapole electrostatic stigmator is disclosed. In embodiments, the dodecapole electrostatic stigmator includes twelve conductive plates arranged about a radius R, the twelve conductive plates comprising a first conductive plate, a second conductive plate, a third conductive plate, a fourth conductive plate, a fifth conductive plate, a sixth conductive plate, a seventh conductive plate, an eighth conductive plate, a ninth conductive plate, a tenth conductive plate, an eleventh conductive plate, and a twelfth conductive plate. In embodiments, the first conductive plate, the third conductive plate, the fifth conductive plate, the seventh conductive plate, the ninth conductive plate, and the eleventh conductive plate are applied with a first focusing voltage in order to eliminate at least one of fourth-order focusing aberrations or sixth-order focusing aberrations of the primary electron beamlet.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which:

FIG. 7 illustrates a simplified view of a first layer of a micro-stigmator array (MSA) micro-lens array (MLA) including a plurality of micro lenses, in accordance with one or more embodiments of the present disclosure.

DETAILED DESCRIPTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Reference will now be made in detail to the subject matter disclosed, which is illustrated in the accompanying drawings.

Embodiments of the present disclosure are directed to a dodecapole electrostatic stigmator configured to eliminate both fourth-order and sixth-order focusing aberrations. Additional embodiments of the present disclosure are directed to a multi-electron beam apparatus including a multi-stigmator array (MSA) including a plurality of dodecapole electrostatic stigmators. Further embodiments of the present disclosure are directed to a micro-stigmator array (MSA) including a plurality of electrostatic stigmators.

As noted previously herein, electron beam inspection systems often utilize a micro-lens array (MLA) comprising hundreds of micro-lenses in order to split primary electron beams into multi-primary electron beamlets. The size of each electron beamlet is in the order of tens of microns, and the beamlets are typically separated by a spacing distance in the order of tens of microns. Due to the large field of view (FOV) of multi-electron beam systems (e.g., ~250 µm) and mechanical tolerances of each micro-lens, astigmatisms within each electron beamlet are inevitable. Larger FOVs result in larger astigmatism aberrations. These focusing aberrations (e.g., fourth-order focusing aberrations, sixth-order focusing aberrations) must be corrected and/or eliminated in order to enable efficient inspection performance.

Micro-stigmator arrays (MSA) are one technique which have been incorporated within MLAs in order to correct and/or remove astigmatism aberrations within multi-electron beam systems. Conventional multi-electron beam systems have utilized quadrupole electrostatic stigmators in order to eliminate aberrations within each electron beamlet. These quadrupole electrostatic stigmators include four conductive plates in a circular configuration, exhibiting a quadrupole bore size. However, conventional quadrupole electrostatic stigmators are unable to completely eliminate fourth-order and/or sixth-order focusing aberrations, thereby generating strong octupole (forth-order) and dodecapole (sixth-order) electrostatic fields. This is partially due to the fact that the size of the electron beamlets exhibit a size which is similar to that of the bore size of each quadrupole electrostatic stigmator (e.g., within 50-75% of bore size).

Conventional electrostatic stigmators have taken various forms, including quadrupole electrostatic stigmators. These may be further understood with reference to FIGS. 1-2.

Figure 1:
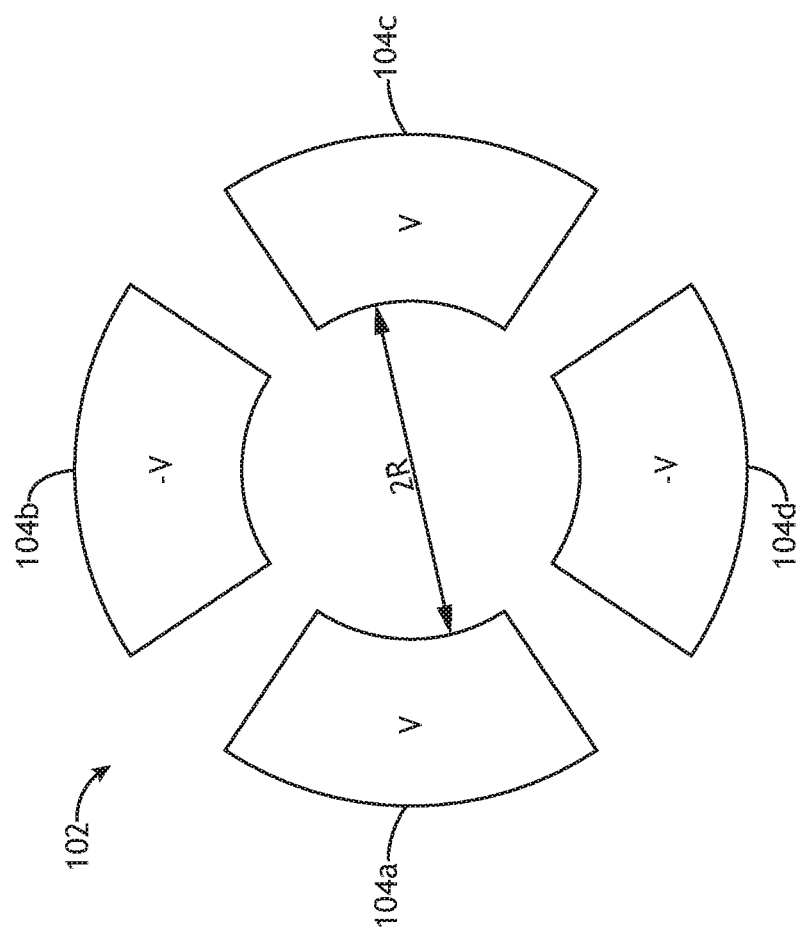
FIG. 1 illustrates a dual-polarity quadrupole electrostatic stigmator.

FIG. 1 illustrates a dual-polarity quadrupole electrostatic stigmator 102. It is contemplated herein that a brief discussion of conventional quadrupole electrostatic stigmators 102 (illustrated in FIGS. 1-2) will provide a base understanding, against which attendant advantages of the present disclosure may be compared.

The quadrupole electrostatic stigmator 102 is provided as an example of a conventional stigmator used to correct astigmatism aberrations. In particular, the quadrupole electrostatic stigmator 102 may be used to correct astigmatism aberrations which may be generated in either a focused or a shaped electron beam apparatus due to mechanical element misalignments, elliptic fabrications, electronic deflections, or projection image-formations. As shown in FIG. 1, a conventional quadrupole electrostatic stigmator 102 may include four conductive plates (e.g., a first conductive plate 104a, a second conductive plate 104b, a third conductive plate 104c, and a fourth conductive plate 104d).

The quadrupole electrostatic stigmator 102 may be configured to apply voltages to the second conductive plate 104b and the fourth conductive plate 104d in order to generate an electronic focusing force along a first direction (e.g., along the y-axis). Conversely, the quadrupole electrostatic stigmator 102 may be configured to apply voltages to the first conductive plate 104a and the third conductive plate 104c in order to generate an electronic de-focusing force along a second direction (e.g., along the x-axis). In this regard, the quadrupole electrostatic stigmator 102 may be configured to correct astigmatism blurs in am imaging plane of an electron beam apparatus by selectively adjusting the voltages (e.g., ±1V) applied on the various conductive plates 104a-104d.

In practice, correcting astigmatisms within an electron beam apparatus may require two separate quadrupole electrostatic stigmators 102 illustrated in FIG. 1 to be deployed along the optical z-axis with a rotation angle of 45°. For example, a first quadrupole electrostatic stigmator 102 may be arranged along the optical z-axis as illustrated in FIG. 1, and a second quadrupole electrostatic stigmator 102 may be arranged along the optical z-axis, wherein the second quadrupole electrostatic stigmator 102 is rotated 45° with respect to the first quadrupole electrostatic stigmator 102.

The conductive plates 104a-104d of the quadrupole electrostatic stigmator 102 may be arranged about a radius R, such that a diameter (bore size) of the quadrupole electrostatic stigmator 102 is characterized by 2R, which may be on the order of tens of microns. In practice, each electron beamlet of a multi-electron beam apparatus would require an individual quadrupole electrostatic stigmator 102 for aberration correction.

As shown in FIG. 1, the first conductive plate 104a and third conductive plate 104c may exhibit a first voltage (+1V), whereas the second conductive plate 104b and fourth conductive plate 104d may exhibit a second voltage (−1V). In order to provide the distinct focusing/de-focusing voltages from voltage sources to the various conductive plates 104a-104d, the quadrupole electrostatic stigmator 102 would require two separate voltage connecting lines: one for the +1V on the first and third conductive plates 104a, 104c, and a second for the −1V on the second and fourth conductive plates 104b, 104d. However, in multi-electron beam apparatuses with hundreds of electron beamlets, requiring two separate voltage connecting lines for every quadrupole electrostatic stigmator 102 (e.g., every beamlet) complicates the fabrication process, adds unnecessary expenses, and slows down production.

Figure 2:
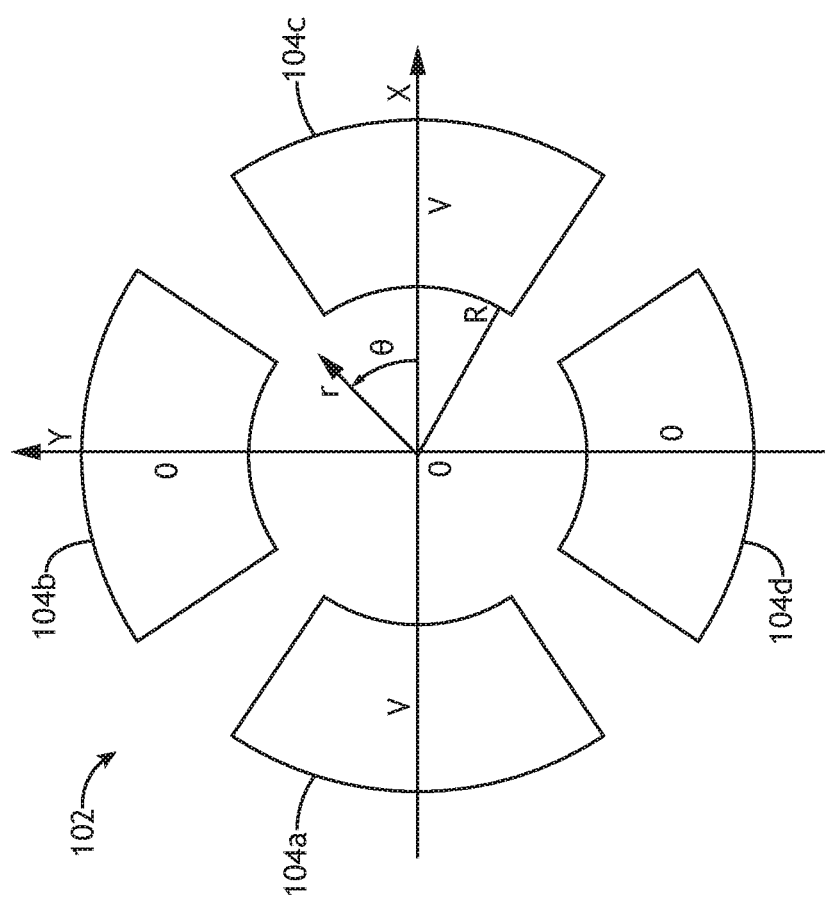
FIG. 2 illustrates a single-polarity quadrupole electrostatic stigmator.

In order to reduce the number of voltage connecting lines required for each quadrupole electrostatic stigmator 102, some conventional multi-electron beam apparatuses have utilized one-power quadrupoles. For example, FIG. 2 illustrates a single-polarity quadrupole electrostatic stigmator 102. As opposed to the dual-polarity quadrupole electrostatic stigmator 102 of FIG. 1, which utilized two separate focusing/de-focusing voltages (±1V), the single-polarity quadrupole electrostatic stigmator 102 of FIG. 2 utilizes only a single de-focusing voltage (+1V) on the first and third conductive plates 104a, 104c.

As a result, the quadrupole electrostatic stigmator 102 of FIG. 2 requires only a single voltage connecting line coupling the first and third conductive plates 104a, 104c to a voltage source. The second and fourth conductive plates 104b, 104d are grounded. While this configuration reduces the number of required voltage connecting lines, the focusing/de-focusing sensitivity of the quadrupole electrostatic stigmator 102 of FIG. 2 is half that of the quadrupole electrostatic stigmator 102 of FIG. 1. Thus, the quadrupole electrostatic stigmator 102 of FIG. 2 is still not suitable for some multi-electron beam apparatuses.

A mathematical derivation of the potential distributions of the quadrupole electrostatic stigmator 102 of FIG. 2 may prove to be helpful. Let $\varphi(r, \theta)$ define the electrostatic potential distributions in $r \leq R$ for the quadrupole electrostatic stigmator 102 of FIG. 2. Expanding $\varphi(r, \theta)$ into a Fourier series yields Equation 1:

$$\varphi(r, \theta) = A_0 + \sum_{k=1}^{\infty} r^k (A_k \cos(k\theta) + B_k \sin(k\theta)) \quad (1)$$

wherein $A_0$, $A_k$, and $B_k$ define the Fourier coefficients, as defined by the boundary condition $\varphi(R, \theta)$.

Equation 1 is an obvious solution of the Laplace equation which defines the electrostatic potential distributions within the bore (e.g., for $r \leq R$) of the quadrupole electrostatic stigmator 102 illustrated in FIG. 2. The Fourier coefficients $A_0$, $A_k$, and $B_k$ in Equation 1 may be defined by Equation 2, Equation 3, and Equation 4, respectively:

$$A_0 = 1/2\pi \int_{-\pi}^{\pi} \varphi(R, \theta) d\theta \quad (2)$$

$$A_k = 1/\pi R^k \int_{-\pi}^{\pi} \varphi(R, \theta) \cos(k\theta) d\theta \quad (3)$$

$$B_k = 1/\pi R^k \int_{-\pi}^{\pi} \varphi(R, \theta) \sin(k\theta) d\theta \quad (4)$$

The symmetrical relations over $(r, \theta)$ with a voltage V applied within the quadrupole electrostatic stigmator 102 may be defined by Equation 5 and Equation 6:

$$\varphi(r, \theta) = \varphi(-r, \theta) \quad (5)$$

$$\varphi(r, \theta) = \varphi(r, -\theta) \quad (6)$$

In meeting the symmetrical conditions of Equation 5 and Equation 6, Equation 1 may be simplified to yield Equation 7:

$$\varphi(r, \theta) = \sum_{k=2}^{\infty} r^k A_k \cos(k\theta) (k = 2, 4, 6, \ldots) \quad (7)$$
$$= A_2 r^2 \cos(2\theta) + A_4 r^4 \cos(4\theta) + A_6 r^6 \cos(6\theta) + \ldots$$

wherein $A_k$ may be defined according to Equation 8:

$$A_k = \frac{C_k}{R^k} \quad (8)$$

The term $C_k$ in Equation 8 is the constants defined by the boundary, and may be defined by Equation 9:

$$C_k = -e\varphi(r, \theta) = f_2 \left(\frac{r}{R}\right)^2 + f_4 \left(\frac{r}{R}\right)^4 + f_6 \left(\frac{r}{R}\right)^6 + \ldots \quad (9)$$

wherein e defines the electron charge.

Accordingly, the electrostatic force (F) in the direction along which the electrical power (V) is applied (e.g., along the x-axis in FIG. 2) may be defined by Equation 10:

$$F(r, \theta) = -e\varphi(r, \theta) = f_2 \left(\frac{r}{R}\right)^2 + f_4 \left(\frac{r}{R}\right)^4 + f_6 \left(\frac{r}{R}\right)^6 + \ldots \quad (10)$$
$$= F_2 + F_4 + F_6 +$$

wherein $F_2$ defines the quadrupole field force, $F_4$ defines the octupole field force, and $F_6$ defines the dodecapole field force, which may respectively be defined according to Equation 11, Equation 12, and Equation 13:

$$F_2 = f_2 \left(\frac{r}{R}\right)^2, f_2 = -eC_2 \quad (11)$$

$$F_4 = f_4 \left(\frac{r}{R}\right)^4, f_4 = -eC_4 \quad (12)$$

$$F_6 = f_6 \left(\frac{r}{R}\right)^6, f_6 = -eC_6 \quad (13)$$

The electrostatic quadrupole field force described in Equation 11 may represent an ideal quadrupole force, within which the astigmatism of an electron optical apparatus has been completely corrected/removed. However, the electrostatic octupole and dodecapole field forces described in Equation 12 and Equation 13 represent high-order electrostatic fields which generate the fourth-order and sixth-order focusing/de-focusing aberrations.

In a conventional single-electron beam apparatus, the size of the electron beam (2r, on the order of sub-millimeter) is relatively small compared to the inner diameter (bore size) of the quadrupole electrostatic stigmator 102 (2R, on the order of tens of millimeters) shown in FIGS. 1-2. For example, in a conventional single-electron beam apparatus, the ratio of r to R is commonly much less than 0.1

$$\left(e.g., \frac{r}{R} \ll 0.1\right).$$

Due to the significant differences in size between the electron beam and the bore size of the quadrupole electrostatic stigmator 102, the octupole and dodecapole field forces described in Equation 12 and Equation 13 typically do not result in significant degradation of image-forming resolutions in the context of a conventional single-electron beam apparatus.

However, the same may not be said for conventional multi-electron beam apparatuses. In conventional multi-electron beam apparatuses with hundreds of beamlets, the inner diameter (bore size) of the quadrupole electrostatic stigmator 102 (2R) is on the order of tens of microns. In order to maximize the utilization rate (η=BC %) of the electron-source-emitted beam currents (BC)

$$\left(e.g., \eta = BC \, \% \left(\frac{r}{R}\right) 2\%\right),$$

the electron beamlet size (2r) is required to be greater than 50% of the inner diameter (2R) of each quadrupole electrostatic stigmator 102

$$\left(e.g., \frac{r}{R} > 50\%\right).$$

In such a case, the electrostatic octupole and dodecapole field forces described in Equation 12 and Equation 13 generate significant high-order aberrations (e.g., fourth-order focusing aberrations, sixth-order focusing aberrations).

Accordingly, embodiments of the present disclosure are directed to electrostatic stigmators which are configured to eliminate fourth-order and sixth-order focusing aberrations, as described in Equation 12 and Equation 13. In order to remove the high-order focusing aberrations and keep high utilization rate of beam currents (η=BC %), the octupole and dodecapole field coefficients ($A_4$, $A_6$) should be reduced or eliminated. Additionally and/or alternatively, driving the integrations of $C_4$ and $C_6$ would theoretically also eliminate the fourth and sixth-order focusing aberrations. The attendant advantages of the present disclosure may be further shown and described with reference to FIGS. 3-14.

Figure 3:
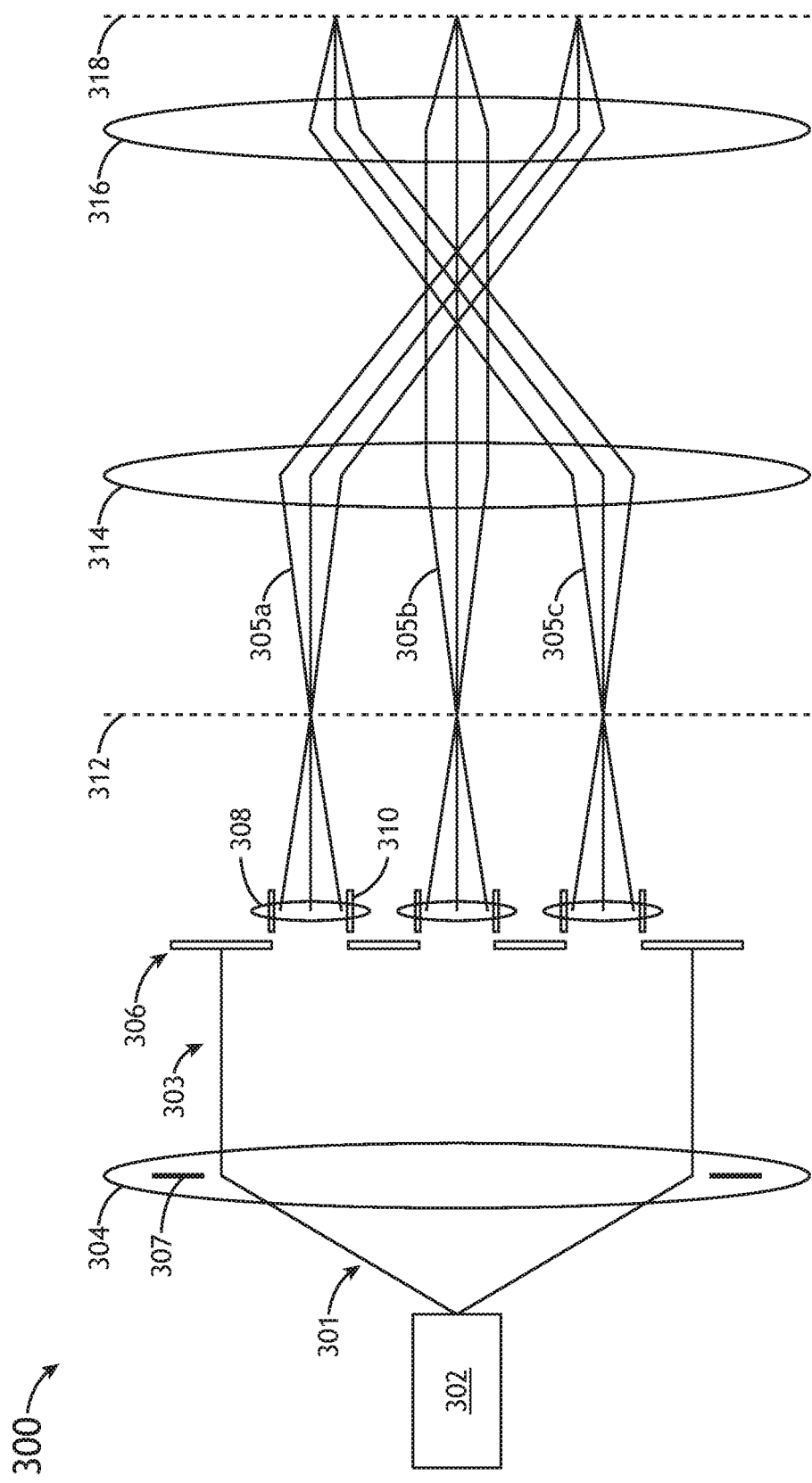
FIG. 3 illustrates a multi-electron beam apparatus, in accordance with one or more embodiments of the present disclosure.

FIG. 3 illustrates a multi-electron beam apparatus 300, in accordance with one or more embodiments of the present disclosure. The multi-electron beam apparatus 300 may include, but is not limited to, an electron source 302, an electron gun lens 304, a micro-aperture array 306 (e.g., MAA 306), a beam-limiting aperture 307 (e.g., BLA 307) a micro-lens array 308 (e.g., MLA 308), a micro-stigmator array 310 (e.g., MSA 310), a transfer lens 314, and an objective lens 316.

In one embodiment, the electron source 302 is configured to emit a source electron beam 301. The electron source 302 may include any type of electron gun or electron emitter known in the art including, but not limited to, thermal field emission (TFE) sources. In another embodiment, the BLA 307 may be configured to select the primary electron beam 303 from the source electron beam 301, and the gun lens 304 may be configured to accelerate and/or focus the primary electron beam 303. The gun lens 304 may be further configured to direct the primary electron beam 303 to the MAA 306.

In another embodiment, the primary electron beam 303 is directed through the MAA 306 to a micro-lens array 308 (e.g., MLA 308). In embodiments, the MLA 308 is configured to receive the primary electron beam and split the primary electron beam 303 into a plurality of electron beamlets 305. For example, the MLA 308 may be configured to split the primary electron beam 303 into hundreds of primary electron beamlets 305. The MLA 308 may be further configured to focus the primary electron beamlets 305 at a crossover plane 312. In this regard, the crossover plane 312 may be regarded as the image plane of the MLA 308/MSA 310. In some embodiments, as will be discussed in further detail herein, the MLA 308 may include an integrated micro-stigmator array 310 (MSA 310). In one embodiment, the MSA 310 may include a plurality of electrostatic stigmators configured to eliminate high-order aberrations from the primary electron beamlets 305.

Subsequently, the transfer lens 314 and the objective lens 316 may be configured to receive the plurality of primary electron beamlets 305 and focus the plurality of primary electron beamlets 305 to a wafer plane. Optical components from the electron source 302 to the crossover plane (e.g., electron source 302, electron gun lens 304, BLA 307, MAA 306, MLA 308, MSA 310, and the like) may be regarded as "illumination optics" of the multi-electron beam apparatus 300. Conversely, the transfer lens 314 and the objective lens 316 may be regarded as "projection optics" of the multi-electron beam apparatus 300. In addition to serving as the image plane of the MLA 308/MSA 310, it is noted herein that the crossover plane 312 may be regarded as the object plane of the projection optics (e.g., transfer lens 314 and the objective lens 316).

In another embodiment, the objective lens 316 is configured to focus and direct the primary electron beamlets 305 to a wafer plane 318. In this regard, the wafer plane 318 may be regarded as the image plane of the projection optics (e.g., transfer lens 314, objective lens 316, and the like). The projection optics may be configured to project the primary electron beamlets 305 to the wafer plane 318 with a defined optical demagnification. In one embodiment, the wafer plane 318 may correspond to the surface of a sample, such that the projection optics are configured to direct and focus the primary electron beamlets 305 to the surface of a sample.

In another embodiment, the MLA 308/MSA 310 may be configured to simultaneously and independently scan each of the primary electron beamlets 305 at the wafer plane 318. Primary electron beamlets 305 at the wafer plane 318 may be used for any characterization processes known in the art including, but not limited to, inspection, review, image-based metrology, and the like.

As noted previously herein, in some embodiments, the MLA 308 may include an integrated micro-stigmator array 310 (e.g., MSA 310). In one embodiment, the MSA 310 may include hundreds of micro electrostatic stigmators configured to remove fourth-order focusing aberrations and/or sixth-order focusing aberrations. For example, the MSA 310 may include a plurality of dodecapole electrostatic stigmators, which may be further shown and described with reference to FIG. 4.

Figure 4:
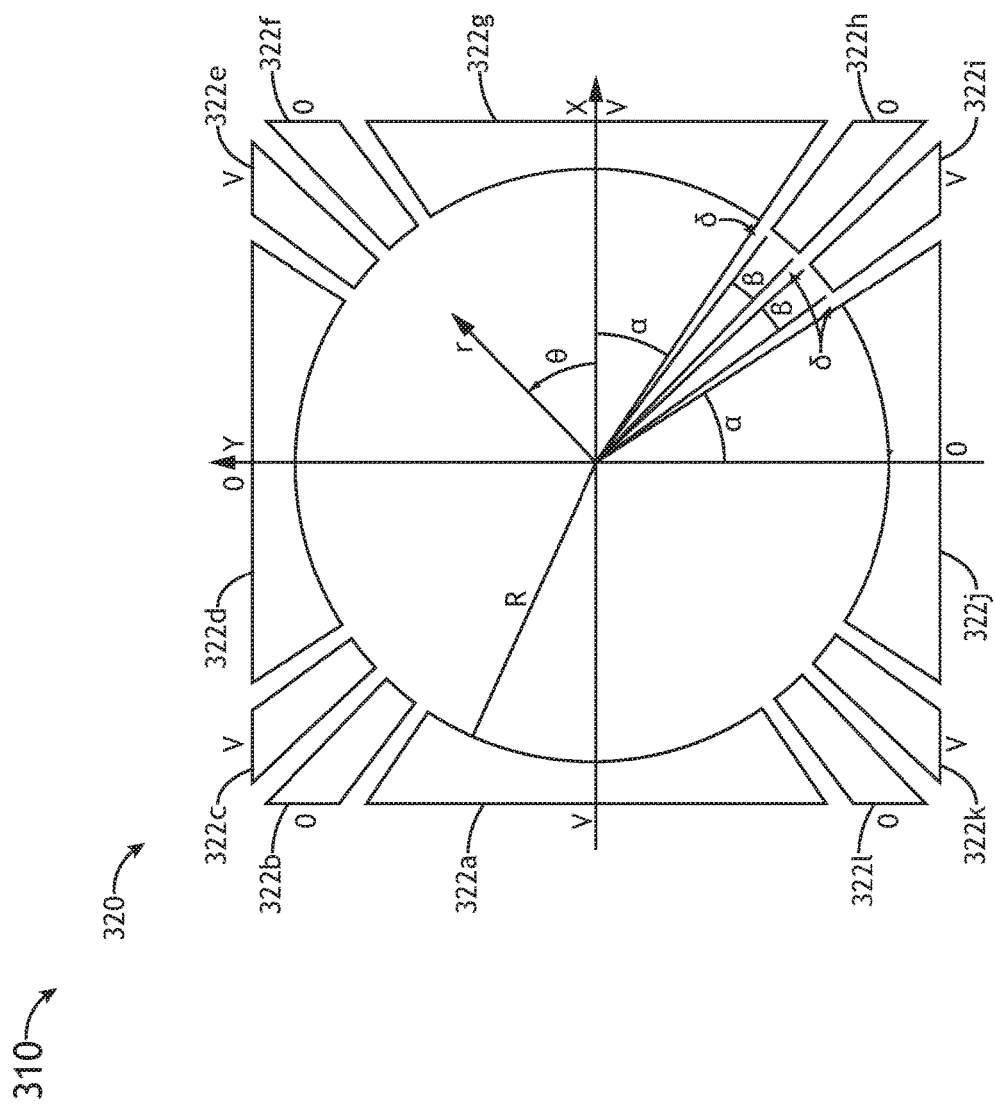
FIG. 4 illustrates a dodecapole electrostatic stigmator of a micro-stigmator array (MSA), in accordance with one or more embodiments of the present disclosure.

FIG. 4 illustrates a dodecapole electrostatic stigmator 320 of a micro-stigmator array 310 (MSA 310), in accordance with one or more embodiments of the present disclosure.

In some embodiments, the dodecapole electrostatic stigmator 320 may include twelve individual conductive plates 322 (e.g., a first conductive plate 322a, a second conductive plate 322b . . . and a twelfth conductive plate 322l). It is contemplated herein that the dodecapole electrostatic stigmator 320 illustrated in FIG. 4 may effectively and efficiently eliminate fourth-order and sixth-order focusing/de-focusing aberrations of primary electron beamlets 305. In this regard, it is further contemplated herein that an MSA 310 including a plurality of dodecapole electrostatic stigmators 320a-320n may be utilized to eliminate focusing aberrations within a multi-electron beam apparatus 300.

In embodiments, the dodecapole electrostatic stigmator 320 may be operated with two separate focusing voltages. For example, as shown in FIG. 4, the first conductive plate 322a, the third conductive plate 322c, the fifth conductive plate 322e, the seventh conductive plate 322g, the ninth conductive plate 322i, and the eleventh conductive plate 322k may be applied with a first focusing voltage of 1V. Conversely, the second conductive plate 322b, the fourth conductive plate 322d, the sixth conductive plate 322f, the eighth conductive plate 322h, the tenth conductive plate 322j, and the twelfth conductive plate 322l may be applied with a second focusing voltage of 0V. The conductive plates 322 which do not exhibit a focusing voltage (e.g., focusing voltages of 0V) may be regarded as "grounded" plates. In embodiments, the focusing voltages may be selectively adjusted in order to selectively reduce and/or eliminate high-order focusing/de-focusing aberrations within the primary electron beamlets 305.

As compared to the dual-polarity quadrupole electrostatic stigmator 102 illustrated in FIG. 1, which requires two separate voltage connecting lines and two voltage sources, each dodecapole electrostatic stigmator 320 requires only a single voltage connecting line and a single voltage source. The fewer number of voltage sources and voltage connecting lines allows the dodecapole electrostatic stigmator 320 to provide numerous spatial and cost advantages over dual-polarity quadrupole electrostatic stigmator 102.

In some embodiments, the plurality of conductive plates 322a-322l may be arranged about a radius R. In embodiments, a first set of the conductive plates 322 may be defined by a plate angle $2\alpha$, whereas a second set of the conductive plates 322 may be defined by a plate angle $\beta$. For example, the first, fourth, seventh, and tenth conductive plates 322a, 322d, 322g, 322j may be defined by a plate angle $2\alpha$ (e.g., defined by a plate angle $\alpha$ per quadrant). Similarly, the second, third, fifth, sixth, eighth, ninth, eleventh, and twelfth conductive plates 322b, 322c, 322e, 322f, 322h, 322i, 322k, 322l may be defined by a plate angle $\beta$. In embodiments, each conductive plate 322a-322l of the twelve conductive plates 322 are separated by a gap angle $\alpha$, as shown in FIG. 4.

It has been found that proper selection of the plate angles $\alpha$, $\beta$, and gap angle $\delta$ of the dodecapole electrostatic stigmator 320 may reduce and/or eliminate the octupole and/or dodecapole fields, and thereby reduce/eliminate the fourth-order and/or sixth-order focusing aberrations. A mathematical analysis of the dodecapole electrostatic stigmator 320 may prove to be illustrative.

The electrostatic potential distributions ($\varphi(r,\theta)$) in $r \leq R$ for the dodecapole electrostatic stigmator 320 may again be described by Equation 7 above. Due to the symmetry of the boundary $\varphi(R,\theta)$ in FIG. 4, the Fourier series coefficient $A_k$ in Equation 7, as applied to the dodecapole electrostatic stigmator 320, may be defined by Equation 14:

$$A_k = 1/\pi R^k \int_{-\pi}^{\pi} \varphi(R, \theta)\cos(k\theta)d\theta = \quad (14)$$

$$= 2/\pi R^k \int_0^{\pi/2} \varphi(R, \theta)\cos(k\theta)d\theta + 2/\pi R^k \int_{\pi/2}^{\pi} \varphi(R, \theta)\cos(k\theta)d\theta$$

$$= A_{k1} + A_{k2}$$

wherein $A_{k1}$ and $A_{k2}$ may be defined by Equation 15 and Equation 16, respectively: m $$A_{k1} = 2/\pi R^k \int_0^{\pi/2} \varphi(R, \theta)\cos(k\theta)d\theta \quad (15)$$

$$A_{k2} = 2/\pi R^k \int_{\pi/2}^{\pi} \varphi(R, \theta)\cos(k\theta)d\theta \quad (16)$$

It is noted herein that, when k=4 (e.g., fourth-order), the Fourier series coefficient $A_{41}$ is equal to zero (e.g., $A_{41}$=0 when k=4). Conversely, when k=6, the Fourier series coefficient $A_{61}$ may be defined by Equation 17:

$$A_{61} = V/3\pi R^6[\sin 6\alpha + \sin 6(\alpha+\delta) - \sin 6(\alpha+\beta+\delta)] \quad (17)$$

Furthermore, when k=4 (e.g., fourth-order), the Fourier series coefficient $A_{42}$ is equal to zero (e.g., $A_{42}$=0 when k=4). Conversely, when k=6, the Fourier series coefficient $A_{62}$ may be defined by Equation 18:

$$A_{62} = V/3\pi R^6[\sin 6\alpha + \sin 6(\alpha+\delta) - \sin 6(\alpha+\beta+\delta)] \quad (17)$$

Further derivations may yield Equation 19 and Equation 20:

$$A_4 = A_{41} + A_{42} = 0 + 0 = 0 \quad (19)$$

$$A_6 = A_{61} + A_{62} = 2V/3\pi R^6[\sin 6\alpha + \sin 6(\alpha+\delta) - \sin 6(\alpha+\beta+\delta)] \quad (20)$$

Subsequently, Equation 21 may follow according to the gap angle $\delta$ definition in FIG. 4:

$$\alpha + \beta = \frac{\pi/2 - 3\delta}{2} \quad (21)$$

Substituting Equation 21 into Equation 20 yields Equation 22:

$$A_6 = \frac{2V}{3\pi R^6} f(\alpha) \quad (22)$$

wherein $f(\alpha)$ may be defined by Equation 23:

$$f(\alpha) = \cos 3\delta + (1 + \cos 6\delta)\sin 6\alpha + \sin 6\delta \cos 6\alpha \quad (23)$$

A review of Equation 22 and Equation 23 reveals that, for a given gap angle $\delta$, the Fourier series coefficient $A_6$ may be equal to zero due to $f(\alpha)$ being zero at certain plate angles $\alpha$. In other words, the Fourier series coefficient $A_6$, and therefore sixth-order focusing aberrations, may be eliminated by careful selection of the plate angle $\alpha$ of the dodecapole electrostatic stigmator 320. This may be further understood with reference to FIG. 5.

Figure 5:
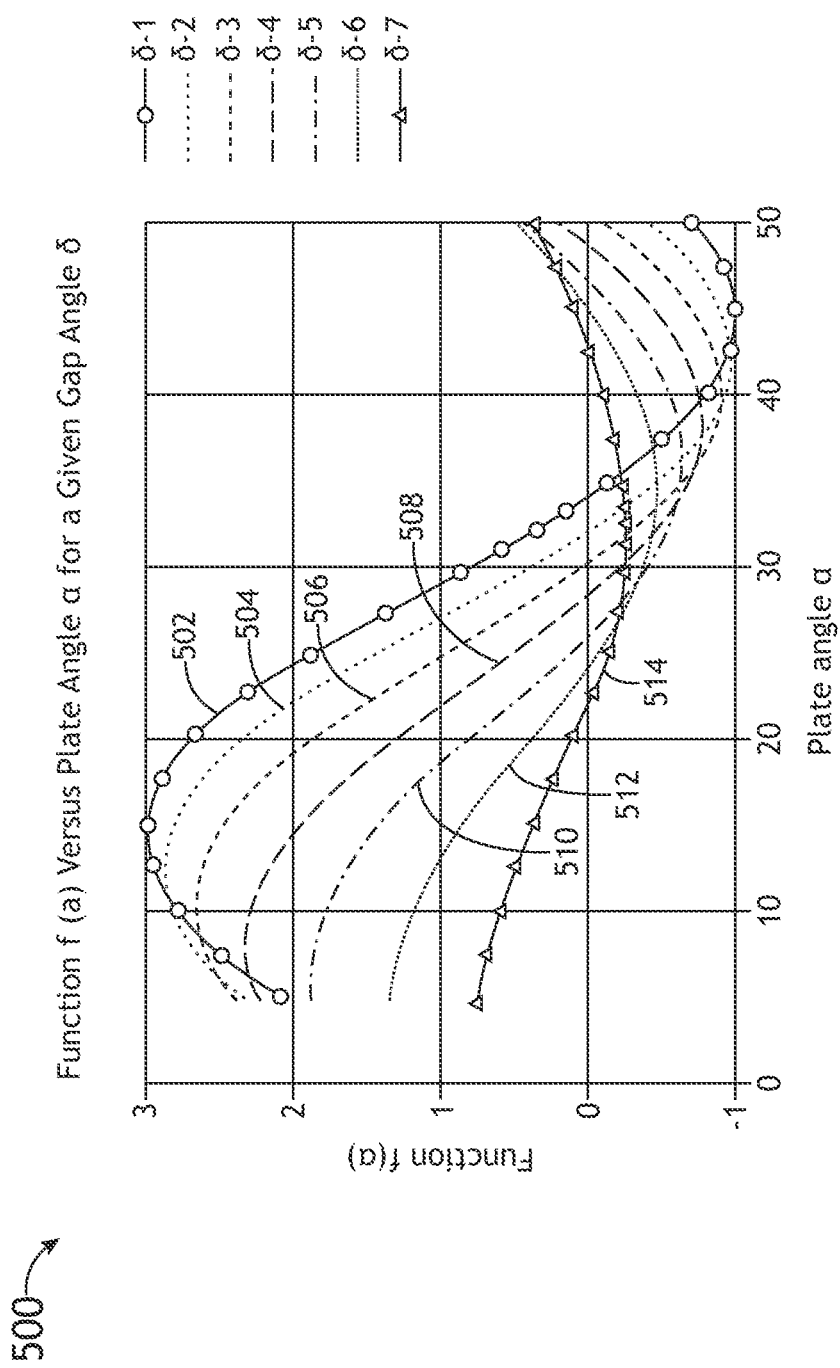
FIG. 5 depicts a graph illustrating a relationship of plate angle (a) of a dodecapole electrostatic stigmator on sixth-order focusing aberrations, in accordance with one or more embodiments of the present disclosure.

FIG. 5 depicts a graph 500 illustrating a relationship of plate angle ($\alpha$) of a dodecapole electrostatic stigmator 320 on sixth-order focusing aberrations, in accordance with one or more embodiments of the present disclosure.

Curves 502-514 illustrate the relationship of $f(\alpha)$ and plate angle $\alpha$ for varying gap angles $\delta$ (e.g., $\delta_1$, $\delta_2$, $\delta_3$, $\delta_4$, $\delta_5$, $\delta_6$). As shown in graph 500, there exists only one plate angle $\alpha$ within the range of 20~35° for each respective gap angle $\delta$ which makes the function $f(\alpha)$ (and therefore the Fourier series coefficient $A_6$) equal to zero. For example, for a first given gap angle $\delta_1$, there exists only one plate angle $\alpha$ within the range of 20~35° which makes the Fourier series coefficient $A_6$ equal to zero by making the function $f(\alpha)$ equal to zero. By way of another example, for a second given gap angle $\delta_2$, there exists only one plate angle $\alpha$ within the range of 20~35° which makes the Fourier series coefficient $A_6$ equal to zero by making the function $f(\alpha)$ equal to zero.

Continuing with the derivation of the dodecapole electrostatic stigmator 320, and according to Equation 21, the plate angle $\beta$ may be selected according to Equation 24:

$$\beta = 45° - \alpha - \frac{3\delta}{2} \quad (24)$$

Assuming that the plate angle $\beta$ is greater than zero (e.g., $\beta > 0$), the gap angle $\delta$ may be given by Equation 25:

$$\delta < 30° - \frac{2}{3}\alpha \quad (25)$$

Accordingly, in some embodiments, and in order to eliminate fourth-order focusing aberrations and/or sixth-order focusing aberrations of the primary electron beamlets 305, the respective plate angles $\alpha$, $\beta$ and gap angles $\delta$ of the dodecapole electrostatic stigmator 320 may be selected according to Equation 24 and Equation 25.

Figure 6:
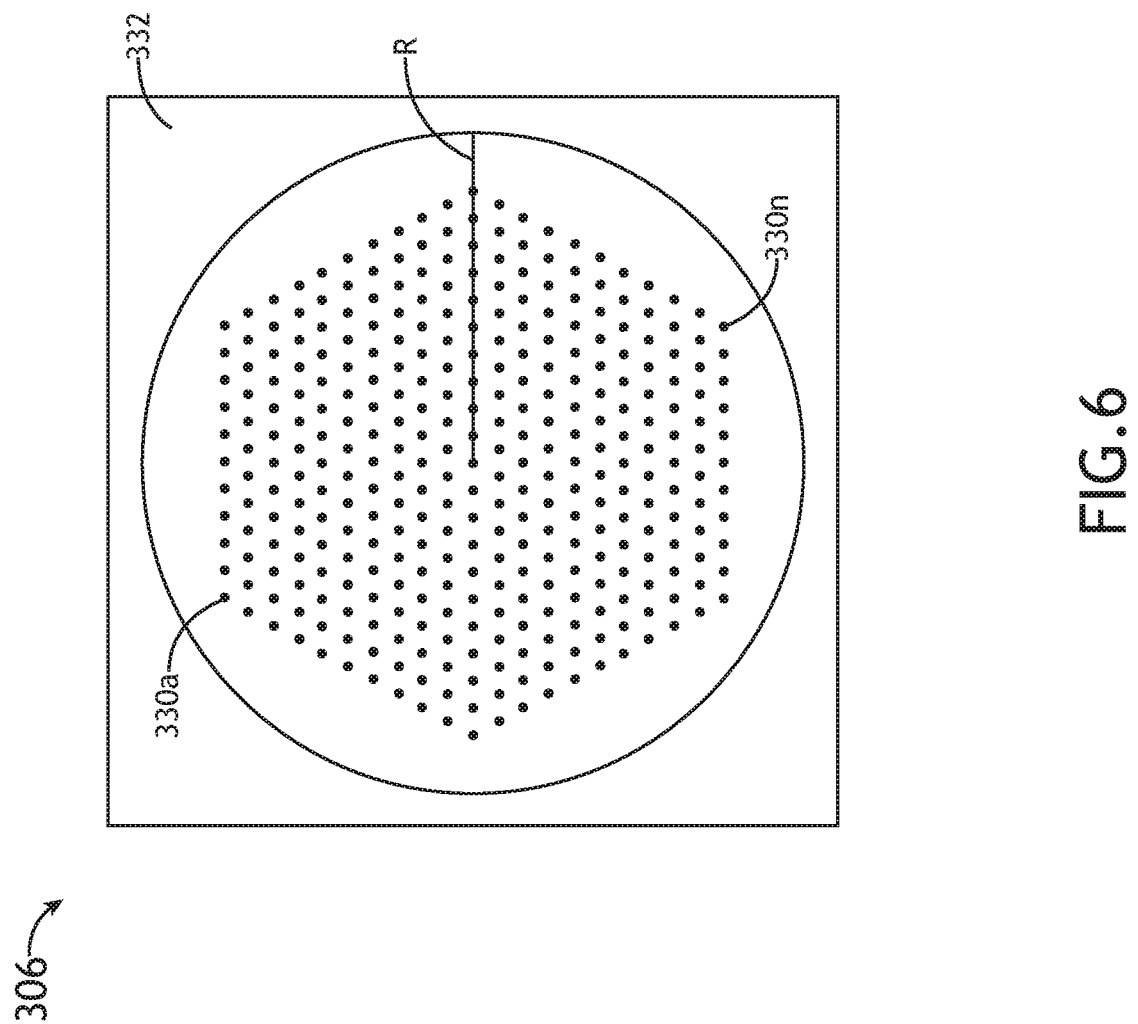
FIG. 6 illustrates a simplified view of a micro-aperture array (MAA), in accordance with one or more embodiments of the present disclosure.

FIG. 6 illustrates a simplified view of a micro-aperture array 306 (MAA 306) of the multi-electron beam apparatus 300, in accordance with one or more embodiments of the present disclosure.

In embodiments, the MAA 306 may include a plurality of aperture holes 330a-330n disposed within an aperture membrane 332. The plurality of aperture holes 330a-330n may be arranged in any arrangement or configuration known in the art. For example, as shown in FIG. 6, the plurality of aperture holes 330a-330ns may be arranged on the aperture membrane 332 in a hexagonal configuration. It is noted herein that a hexagonal configuration may comprise the closest configuration to achieving rotational symmetry, and may provide a number of optical advantages.

It is further noted herein that the number of aperture holes 330a-330n within the MAA 306 may define the number of primary electron beamlets 305 generated within the multi-electron beam apparatus 300. For example, the electron source 302 may be configured to generate a source electron beam 301, and the BLA 307 may direct a primary electron beam 303 to the MAA 306. The source electron beam 301 incident upon the MAA 306 may then be split into a plurality of primary electron beamlets 305, wherein the number and configuration of the primary electron beamlets 305 are at least partially defined by the number and configuration of the aperture holes 330a-330n.

The BLA 307 may be selectively adjusted in order to selectively adjust a diameter of the primary electron beam 303, which is illustrated as 2R in FIG. 6. The size of the BLA 307 may be optimized to allow the primary electron beam 303 to sufficiently illuminate the MAA 306 (e.g., eliminate each respective aperture hole 330a-330n). Additionally, the size of the BLA 307 may be selected in order to reduce and/or eliminate various optical blurs generated by the gun lens 304, the MLA 308, and by Coulomb interactions between electrons.

In embodiments, the aperture holes may exhibit a diameter d of 2a (e.g., d=2a), and the pitch between adjacent aperture holes 330a-330n may be defined by a pitch p. The pitch may be measured from the centers of each of the aperture holes 330a-330n.

FIG. 7 illustrates a simplified view of a first layer of a micro-lens array 308 (MLA 308) including a plurality of micro lenses 334a-334n, in accordance with one or more embodiments of the present disclosure.

In embodiments, the MLA 308 may include a plurality of micro-lenses 334a-334n disposed within a conductive membrane 336. The of micro-lenses 334a-334n may include any micro-lenses known in the art including, but not limited to, micro Einzel lenses. In embodiments, each of the micro-lenses 334a-334n may be applied with focusing voltages. In one embodiment, the voltages applied to each of the micro-lenses 334a-334n may be controlled independently of one another. In one embodiment, the applied voltages may be configured to be equal for each micro-lens 334a-334n.

The conductive membrane 336 may be on the order of tens of microns thick. The plurality of micro-lenses 334a-334n may be arranged in any arrangement or configuration known in the art. In some embodiments, the plurality of micro-lenses 334a-334n may be arranged in a configuration which substantially conforms or matches to the configuration of aperture holes 330a-330n of the MAA 306. For example, as shown in FIG. 7, the plurality of micro-lenses 334a-334n may be arranged on the conductive membrane 336 in a hexagonal configuration which maps to (e.g., corresponds to) the hexagonal configuration of the aperture holes 330a-330n, as illustrated in FIG. 6. In this regard, the plurality micro-lenses 334a-334n may exhibit a circular shape with the same diameters/bore size (e.g., d=2a), pitch p, and configuration/arrangement as the aperture holes 330a-330n.

It is noted herein that the micro-lens array 308 illustrated in FIG. 7 pictures only one conductive membrane 336. It is further noted herein, however, that the MLA 308 may include three separate membranes with gaps on the order of tens of microns between each of the conductive membranes. For example, the MLA 308 may include a first conductive membrane 336, one or more insulating layers, one or more focusing electrodes, and one or more additional conductive membranes. In this regard, the MLA 308 may include a uni-potential lens (e.g., Einzel lens). In embodiments, a middle membrane of the MLA 308 may be used as a focusing element on which a global voltage is applied to image the primary electron beamlets 305 onto the crossover plane 312. Conversely, if two different voltages are applied on two conductive membranes of the MLA 308 (e.g., conductive membrane 336), the MLA 308 may be used as an acceleration MLA and/or a deceleration MLA.

Figure 8A:
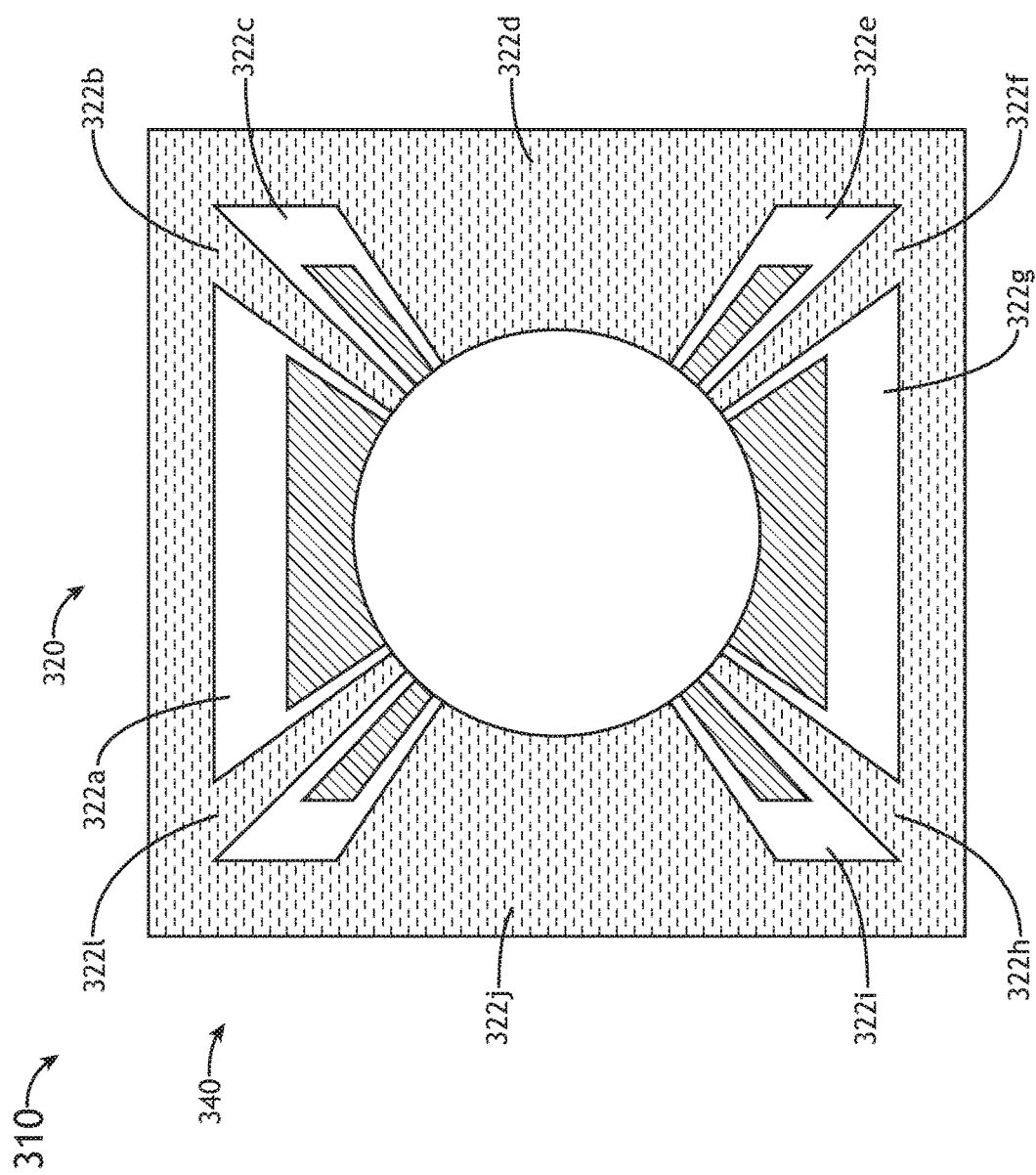
FIG. 8A illustrates a simplified elevation view of a first layer of a dodecapole electrostatic stigmator, in accordance with one or more embodiments of the present disclosure.
Figure 8B:
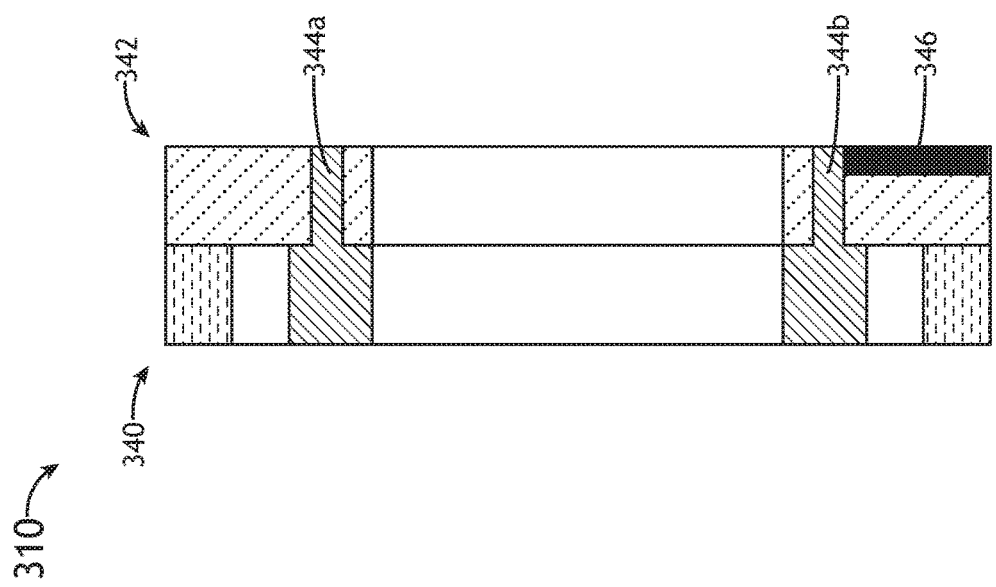
FIG. 8B illustrates a simplified cross-sectional view of a dodecapole electrostatic stigmator, in accordance with one or more embodiments of the present disclosure.
Figure 8C:
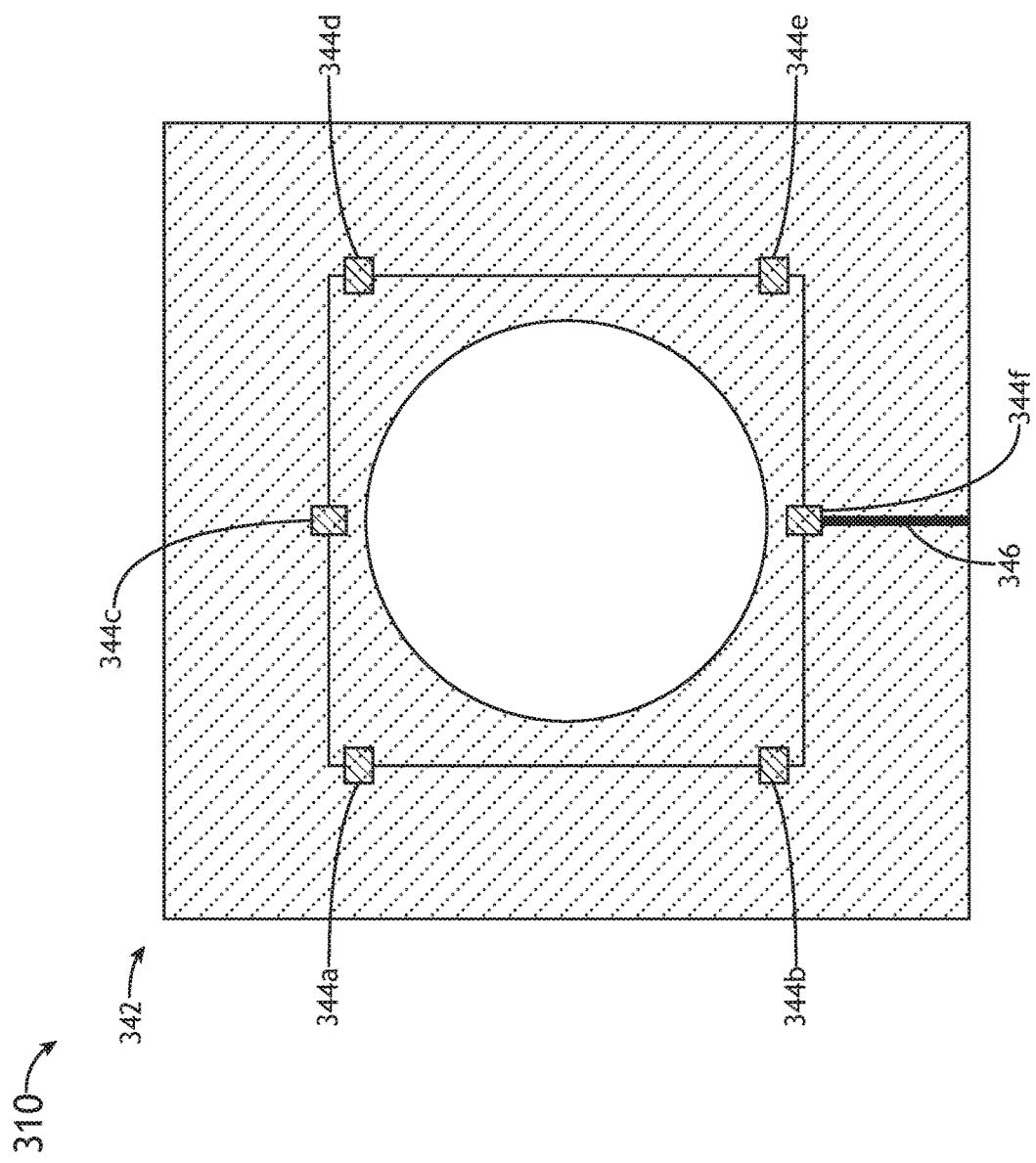
FIG. 8C illustrates a simplified elevation view of an insulator layer of a dodecapole electrostatic stigmator, in accordance with one or more embodiments of the present disclosure.

FIG. 8A illustrates a simplified elevation view of a first layer 340 of a dodecapole electrostatic stigmator 320 of a MSA 310, in accordance with one or more embodiments of the present disclosure. FIG. 8B illustrates a simplified cross-sectional view of a dodecapole electrostatic stigmator 320 of an MSA 310, in accordance with one or more embodiments of the present disclosure. FIG. 8C illustrates a simplified elevation view of an insulator layer 342 of a dodecapole electrostatic stigmator 320 of an MSA 310, in accordance with one or more embodiments of the present disclosure.

In embodiments, a dodecapole electrostatic stigmator 320 may include a first layer 340 coupled to a second insulator layer 342. For example, as shown in FIG. 8A, the conductive plates 322a-322l may be fabricated on the first layer 340, wherein the first layer 340 is coupled to the insulator layer 342, as shown in FIG. 8B. In this regard, the plurality of conductive plates 322a-322l may be said to be disposed and/or fabricated on the insulator layer 342. The plurality of conductive plates 322a-322l may be fabricated on the insulator layer 342 via any fabrication techniques known in the art including, but not limited to, micro-electro-mechanical systems (MEMS) fabrication techniques.

It is noted herein that the dodecapole electrostatic stigmator 320 illustrated in FIG. 8B is rotated 90° with respect to the dodecapole electrostatic stigmator 320 illustrated in FIG. 4. In embodiments, the zero-voltage conductive plates 322 (e.g., conductive plates 322b, 322d, 322f, 322h, 322j, 322l) may be connected together as grounded plates.

As noted previously herein, there is a desire to reduce the number of voltage connecting lines and the number of voltage sources required for the dodecapole electrostatic stigmators 320 and MSA 310. Accordingly, in some embodiments, each dodecapole electrostatic stigmator 320 may include a plurality of connecting pins 344a-344f configured to electrically couple at least some of the conductive plates 322 to a voltage source via at least one voltage connecting line 346. In this regard, the plurality of conductive plates 322 may be electrically coupled to one or more voltage sources via the connecting pins 344a-344f and one or more voltage connecting lines 346. For example, the plurality of voltage-enabled conductive plates 322 (e.g., conductive plates 322a, 322c, 322e, 322g, 322i, 322k) may be electrically coupled to a single voltage connecting line 346 via a plurality of connecting pins 344a-344f. The voltage connecting line 346 may be configured to electrically couple each of the conductive plates 322a, 322c, 322e, 322g, 322i, 322k to one another, as well as electrically couple the conductive plates 322a, 322c, 322e, 322g, 322i, 322k to a voltage source.

In embodiments, the one or more voltage sources are configured to apply one or more focusing voltages to each dodecapole electrostatic stigmator 320 of the plurality of dodecapole electrostatic stigmators 320 of the MSA 310. In particular, a controller including one or more processors and a memory may be coupled to the voltage sources, and may be configured to cause the voltage sources to selectively apply/adjust focusing voltages applied to the conductive plates 322. For example, the focusing voltages applied to the dodecapole electrostatic stigmators 320 of the MSA 310 may be selectively adjusted in order to selectively adjust one or more characteristics of the plurality of primary electron beamlets 305. For instance, the focusing voltages applied to the dodecapole electrostatic stigmators 320 of the MSA 310 may be selectively adjusted in order to selectively remove an octupole field and a dodecapole field of each primary electron beamlet of the plurality of primary electron beamlets. In this regard, focusing voltages may be selectively adjusted in order to eliminate fourth-order focusing aberrations and/or sixth-order focusing aberrations. By way of another example, the focusing voltages applied to the dodecapole electrostatic stigmators 320 of the MSA 310 may be selectively adjusted in order to individually adjust a position of each primary electron beamlet 305 at the crossover plane 312 and/or the wafer plane 318.

Figure 9A:
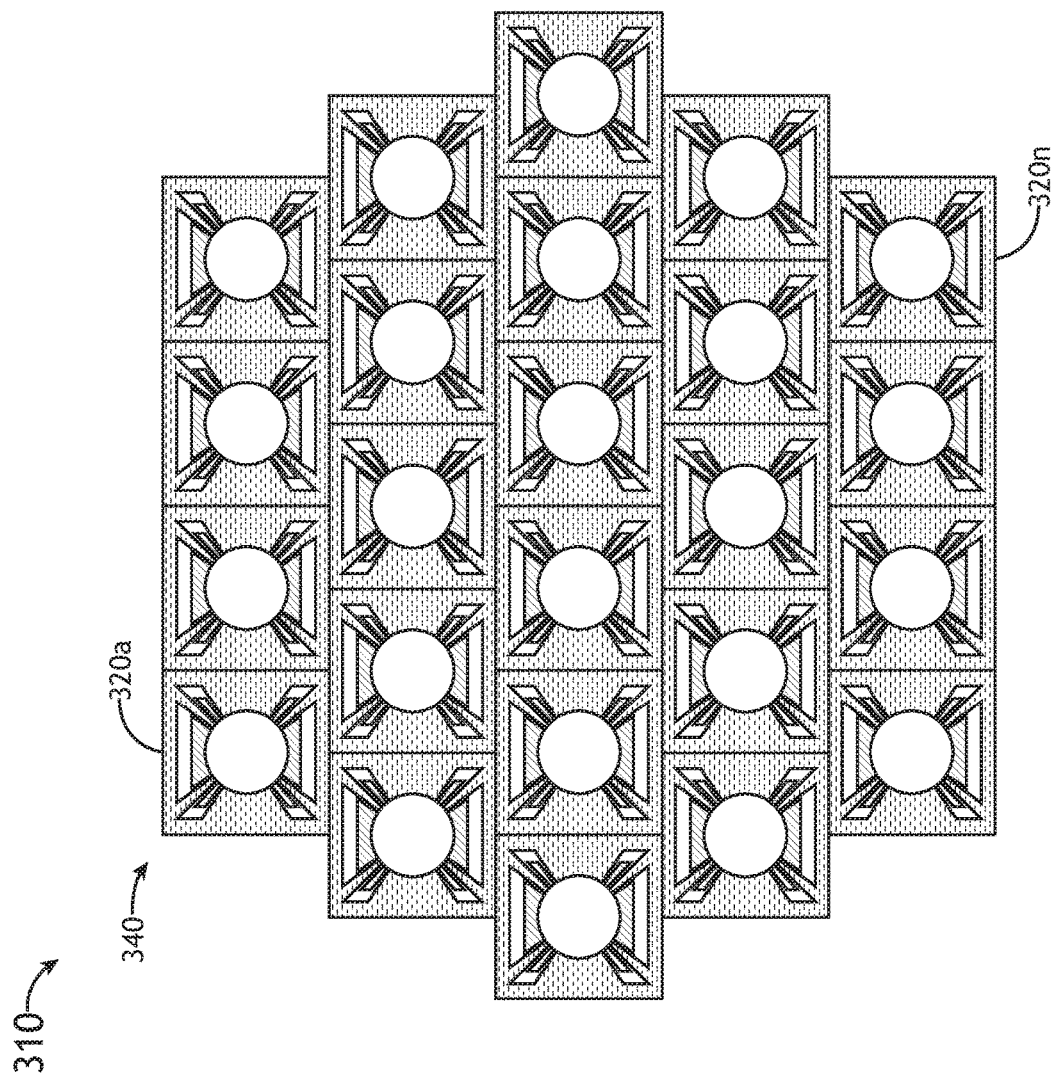
FIG. 9A illustrates a simplified view of a first layer of a micro-stigmator array (MSA) including a plurality of dodecapole electrostatic stigmators, in accordance with one or more embodiments of the present disclosure.
Figure 9B:
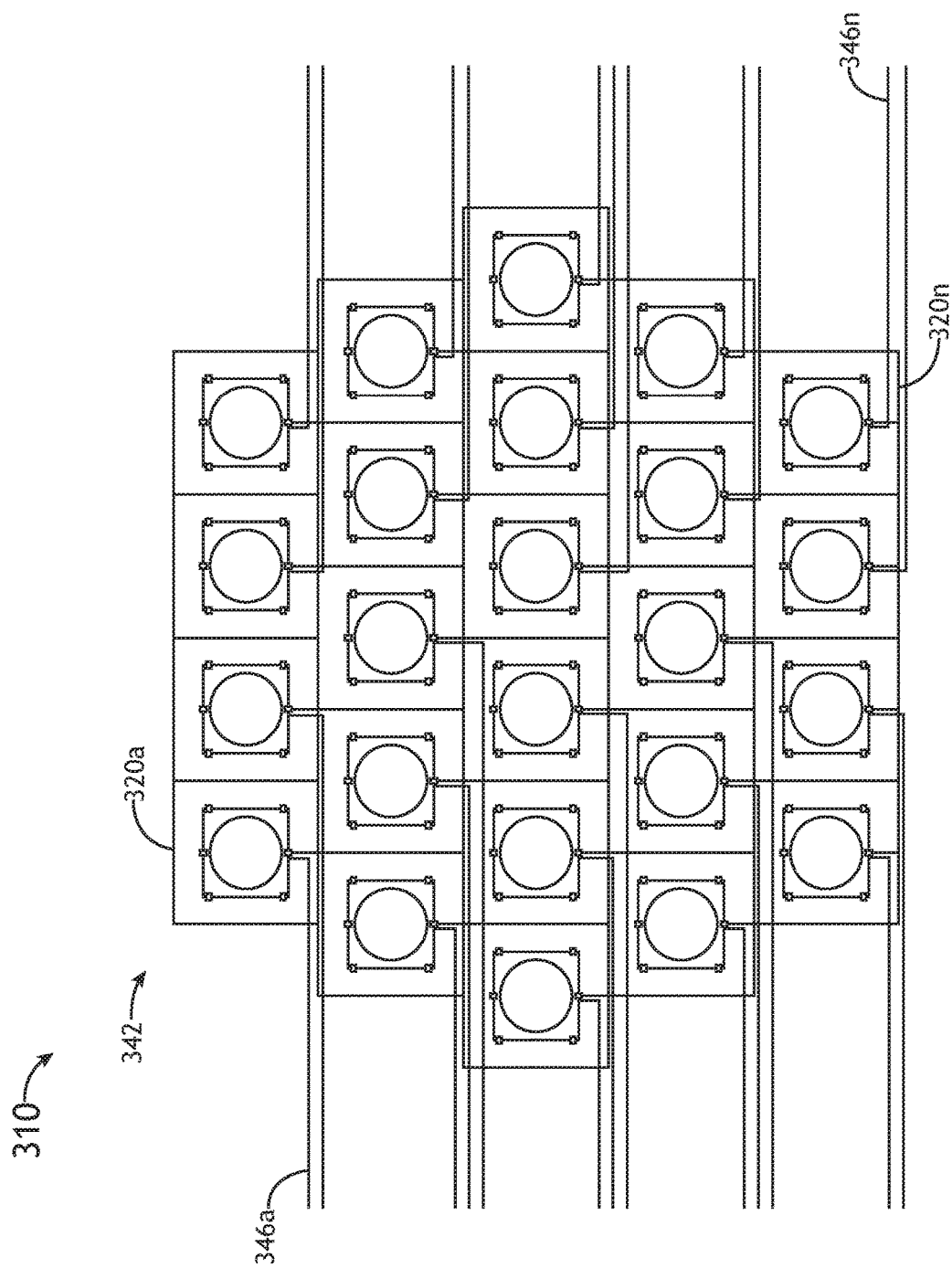
FIG. 9B illustrates a simplified view of an insulator layer of a micro-stigmator array (MSA) including a plurality of dodecapole electrostatic stigmators, in accordance with one or more embodiments of the present disclosure.

FIG. 9A illustrates a simplified view of a first layer 340 of a micro-stigmator array 310 (MSA 310) including a plurality of dodecapole electrostatic stigmators 320a-320n, in accordance with one or more embodiments of the present disclosure. FIG. 9B illustrates a simplified view of an insulator layer 342 of the MSA 310 including the plurality of dodecapole electrostatic stigmators 320a-320n, in accordance with one or more embodiments of the present disclosure.

In embodiments, the MSA 310 may include a plurality of dodecapole electrostatic stigmators 320a-320n. The plurality of dodecapole electrostatic stigmators 320a-320n may be arranged in any arrangement or configuration known in the art. In some embodiments, the plurality of dodecapole electrostatic stigmators 320a-320n may be arranged in a configuration which substantially conforms or matches to the configuration of aperture holes 330a-330n of the MAA 306 and/or the plurality of micro-lenses 334a-334n of the MLA 308. For example, as shown in FIG. 9A, the plurality of dodecapole electrostatic stigmators 320a-320n may be arranged in a hexagonal configuration which maps to (e.g., corresponds to) the hexagonal configuration of the aperture holes 330a-330n and/or micro-lenses 334a-334n, as illustrated in FIGS. 6-7.

In embodiments, the pitch between each of the dodecapole electrostatic stigmators 320a-320n may be on the order of hundreds of microns. For example, the dodecapole electrostatic stigmators 320a-320n may be spaced from one another by a pitch of approximately 100 μm. As shown in FIG. 9B, each dodecapole electrostatic stigmator 320a-320n may be individually addressable (e.g., coupled to a voltage source) via a single voltage connecting line 346a-346n.

It is noted herein that astigmatism blurs within the plurality of primary electron beamlets 305 may be characterized by elliptic spots. For each primary electron beamlet 305, the direction of the elliptic spot (e.g., the long axis or shot axis of an elliptic spot) may be randomly varied. In order to correct the astigmatisms with a random direction for each respective primary electron beamlet 305, the multi-electron beam apparatus 300 may include two separate MSAs 310a, 310b arrange in the optical axis, wherein the two separate MSAs 310a, 310b are arranged at a rotation angle of 45° with respect to one another.

Figure 10B:
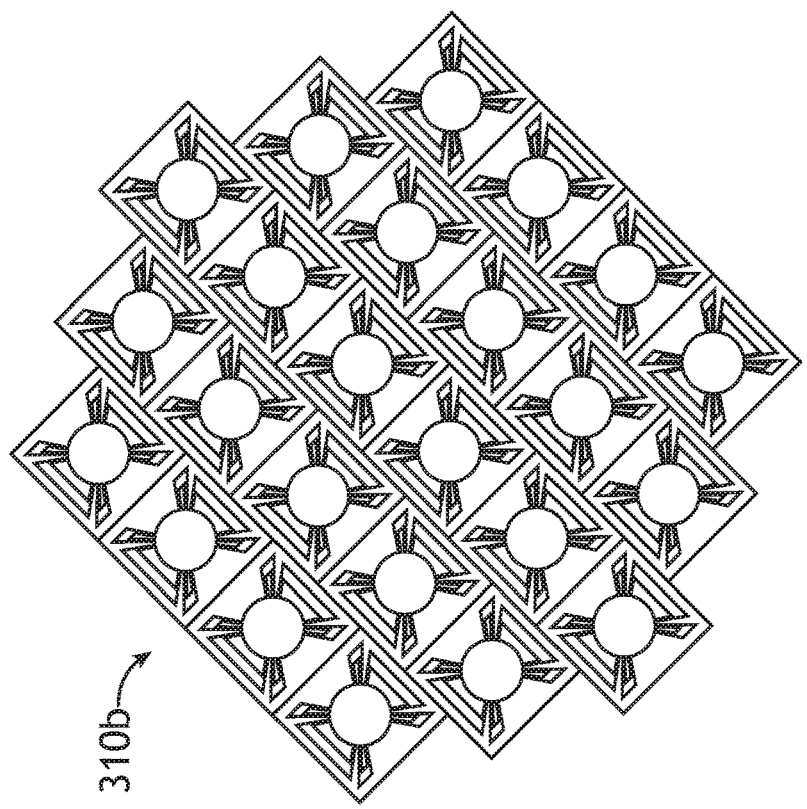
FIG. 10B illustrates a simplified view of a second micro-stigmator array (MSA) in a second orientation, in accordance with one or more embodiments of the present disclosure.
Figure 10A:
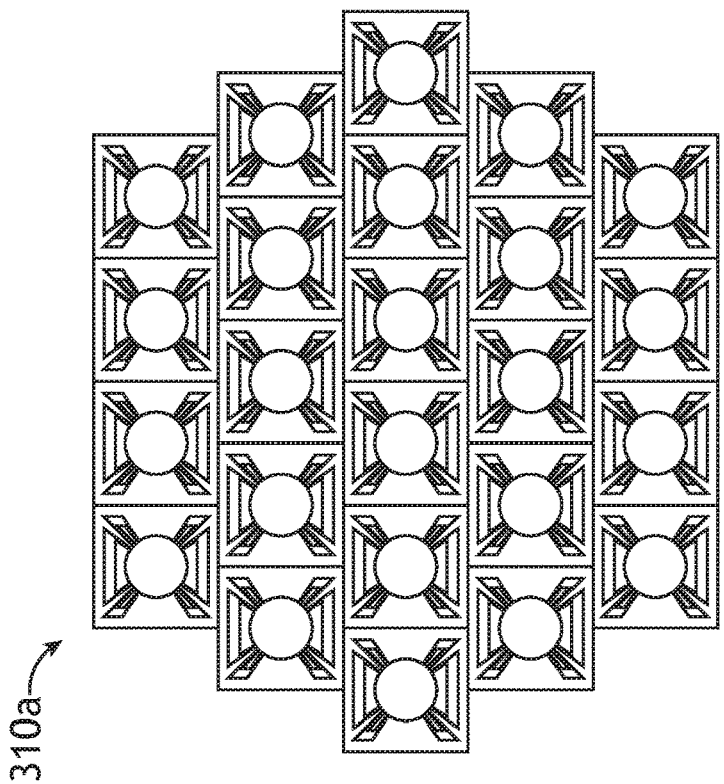
FIG. 10A illustrates a simplified view of a first micro-stigmator array (MSA) in a first orientation, in accordance with one or more embodiments of the present disclosure.

For example, FIG. 10A illustrates a simplified view of a first micro-stigmator array 310a (MSA 310a) in a first orientation, and FIG. 10B illustrates a simplified view of a second micro-stigmator array 310b (MSA 310b) in a second orientation. Comparing the first MSA 310a to the second MSA 310b, it may be seen that the second MSA 310b is rotated 45° with respect to the first MSA 310a. In embodiments, the first MSA 310a and the second MSA 310b may be coupled to one another. Additionally, the first MSA 310a and the second MSA 310b may be separated by one or more insulator membranes. The insulator membranes may exhibit a thickness on the order of tens of microns.

Maximizing the utilization rate of the illuminating beam current (BC) is an important aspect of a multi-electron beam system (e.g., multi-electron beam apparatus 300). The utilization rate η may be defined according to Equation 26:

$$\eta = \frac{\text{Total Aperture} - \text{Selected } BC}{\text{Total } BLA - \text{Selected } BC} = 4N\left(\frac{a}{BLA}\right)^2 \qquad (26)$$

wherein N is the total number of primary electron beamlets 305, a is the radius of the aperture holes 330a-330n, and BLA is the diameter of the BLA 307 (e.g., BLA=2R in FIG. 6).

For example, assume that the primary electron beam 303 (selected by the BLA 307) is directed to the MAA 306 such that it telecentrically illuminates the MAA 306. In this example, the primary electron beam 303 is split up into 330 primary electron beamlets 305 (e.g., N=331) which are arranged according to the hexagonal configuration of the MAA 306, as shown in FIG. 6. The pitch p between the aperture holes 330a-330n may be 100 µm, which may be necessary for a 50 µm inner bore diameter of the microlenses 334a-334n of the MLA 308. Further assume that the size of the primary electron beam 303 (e.g., diameter of the BLA 307) is 10% greater than the max corner-to-corner beamlet distance for a reasonable illumination margin, as illustrated in FIG. 6 (e.g., BLA=(1+10%)*21*p=2310 µm). Applying Equation 26 to this example, it may be found that the illuminating BC utilization rate is $\eta$=2.5%, $\eta$=5.6%, and $\eta$=10% for aperture hole 330a-330n radiuses of a=10 µm, a=15 µm, and a=20 µm, respectively.

As may be seen in the example above, the radius a of the aperture holes 330a-330n dominates the BC utilization rate $\eta$ strongly. However, optically, the radius a of the aperture holes 330a-330n can not be designed to be similar in size to the bore size R of the dodecapole electrostatic stigmators 320 due to the octupole and dodecapole field effects defined in Equation 12 and Equation 13, respectively. In order to address these shortfalls of previous techniques, the dodecapole electrostatic stigmator 320 of the present disclosure breaks through these limitations defined above by eliminating the terms of the octupole and dodecapole fields through careful selection of the plate angles $\alpha$, $\beta$ and gap angles $\delta$. In effect, it is contemplated herein that embodiments of the present disclosure may enable improved BC utilization rates $\eta$, thereby increasing throughput in a multi-electron beam apparatus 300 or system.

Figure 11:
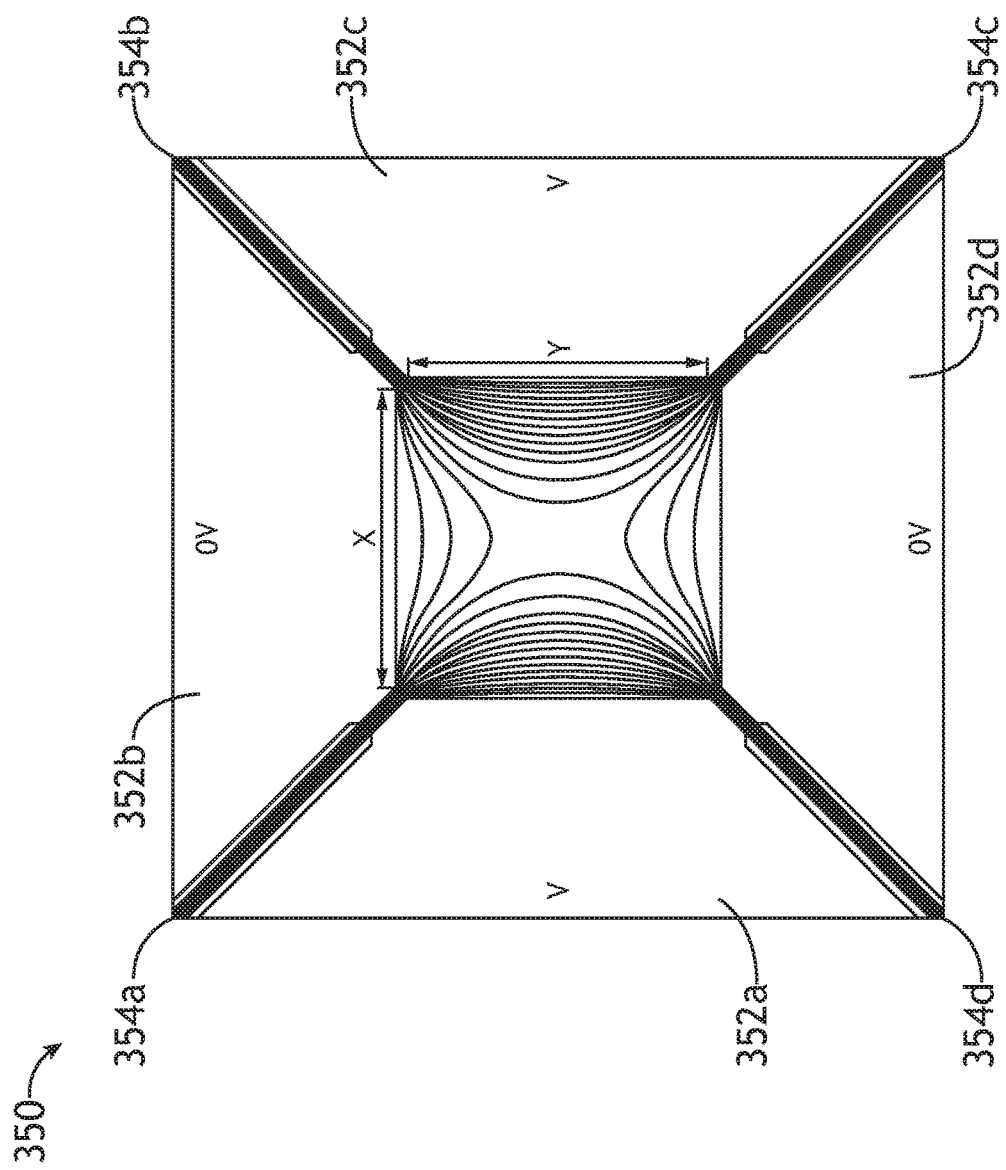
FIG. 11 illustrates a full-square quadrupole electrostatic stigmator of a micro-stigmator array (MSA), in accordance with one or more embodiments of the present disclosure.

FIG. 11 illustrates a full-square quadrupole electrostatic stigmator 350 of a micro-stigmator array 310 (MSA 310), in accordance with one or more embodiments of the present disclosure.

Additional and/or alternative embodiments of the present disclosure are directed to a MSA 310 including one or more full-square quadrupole electrostatic stigmators 350. A full-square quadrupole electrostatic stigmator 350 may include a first conductive plate 352a, a second conductive plate 352b, a third conductive plate 352c, and a fourth conductive plate 352d. In embodiments, each of the conductive plates 352a-352d may be separated by gaps 354a-354d. The full-square quadrupole electrostatic stigmator 350 may include a dual-polarity electrostatic stigmator, or a single-polarity electrostatic stigmator, as shown in FIG. 11.

As opposed to the dodecapole electrostatic stigmator 320 which includes an inner bore in the shape of a circle (or substantially in the shape of a circle), the full-square quadrupole electrostatic stigmator 350 may include an inner bore which is characterized by a square. For example, as shown in FIG. 11, the full-square quadrupole electrostatic stigmator 350 may include an inner bore including four sides, wherein two opposing sides are of length X, two opposing sides are length Y, and wherein X=Y. In additional and/or alternative embodiments, the quadrupole electrostatic stigmator 350 illustrated in FIG. 11 may include a rectangular-shaped quadrupole electrostatic stigmator 350, wherein the inner bore is rectangular shaped such that X≠Y.

It has been found that the full-square quadrupole electrostatic stigmator 350 illustrated in FIG. 11, as well as a rectangular-shaped quadrupole electrostatic stigmator may effectively eliminate both octupole fields and dodecapole fields. In this regard, some embodiments of the MSA 310 of the present disclosure may include a rectangular-shaped and/or a full-square quadrupole electrostatic stigmator 350. Accordingly, any discussion associated with the dodecapole quadrupole electrostatic stigmator 320 may be regarded as applying to the quadrupole electrostatic stigmator 350 of FIG. 11, unless noted otherwise herein.

Figure 12:
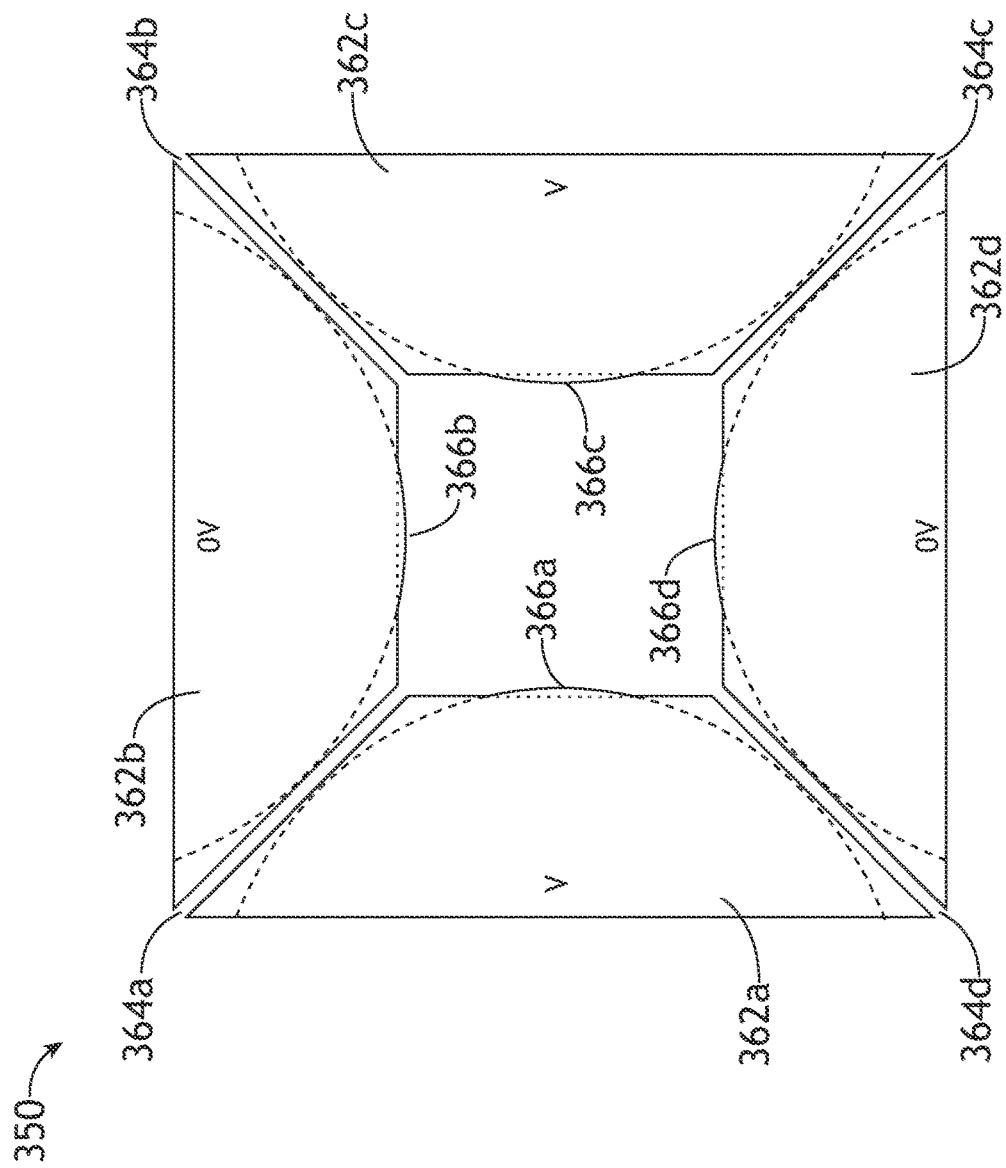
FIG. 12 illustrates a quadrupole electrostatic stigmator including conductive plates with hyperbolic protrusions, in accordance with one or more embodiments of the present disclosure.

FIG. 12 illustrates a quadrupole electrostatic stigmator 360 including conductive plates 362 with hyperbolic protrusions 366, in accordance with one or more embodiments of the present disclosure. It is noted herein that any discussion associated with the rectangular-shaped and/or full-square quadrupole electrostatic stigmator 350 of FIG. 11 and/or the dodecapole electrostatic stigmator 320 may be regarded as applying to the quadrupole electrostatic stigmator 360 of FIG. 12, unless noted otherwise herein.

Additional and/or alternative embodiments of the present disclosure are directed to a quadrupole electrostatic stigmator 360 including hyperbolic protrusions 366. In embodiments, one or more conductive plates 362a-362d of the quadrupole electrostatic stigmator 360 may include a hyperbolic protrusion 366. The hyperbolic protrusions 366 may be configured to extend from the conductive plates 362a-362d inward toward the bore of the quadrupole electrostatic stigmator 360 (e.g., toward the optical axis of the quadrupole electrostatic stigmator 360). In embodiments, the hyperbolic protrusions 366a-366d may extend approximately 1 µm inward toward the center of the bore of the quadrupole electrostatic stigmator 360. It has been found that the quadrupole electrostatic stigmator 360 may effectively minimize both the octupole fields and dodecapole fields.

Figure 13:
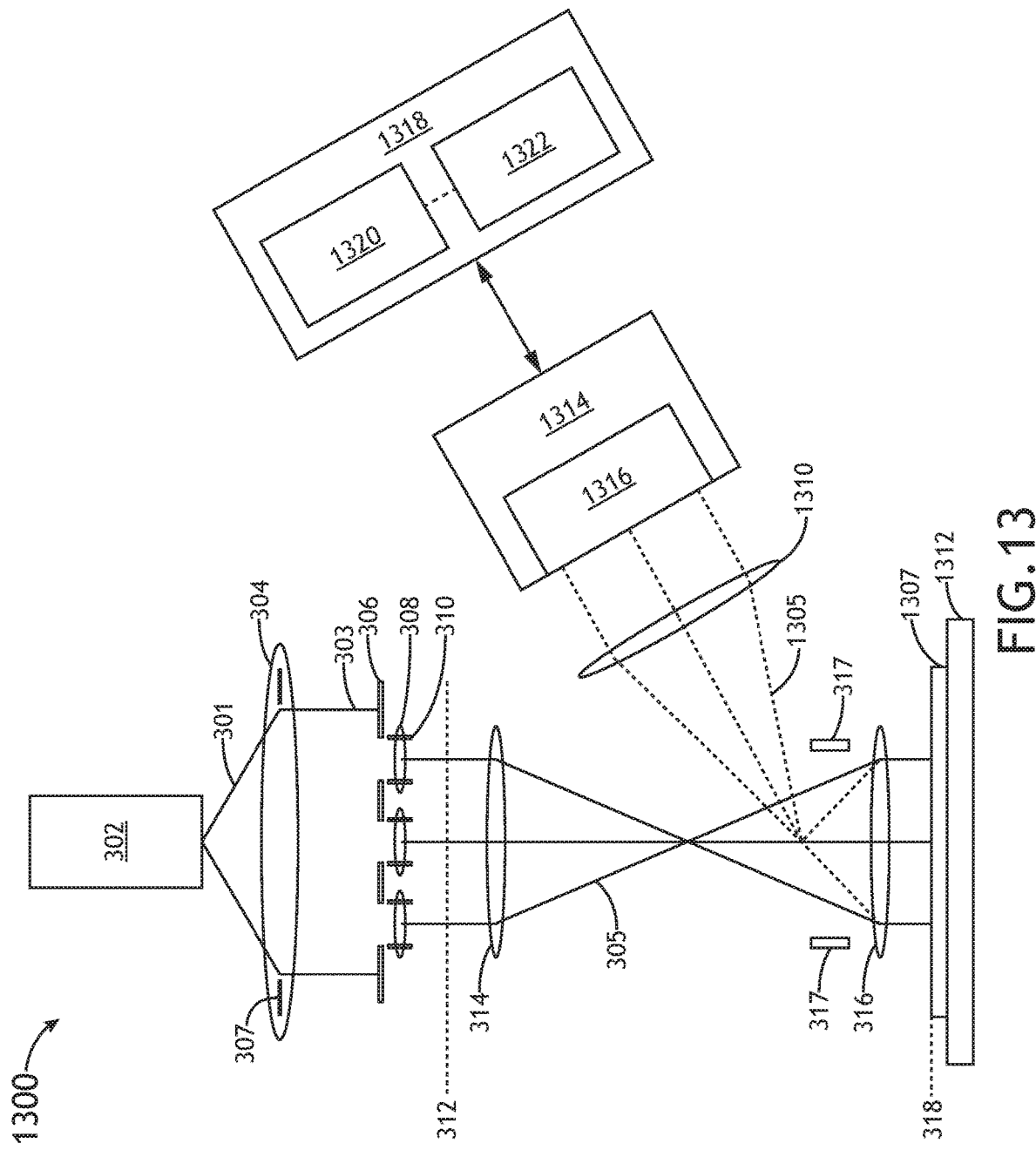
FIG. 13 illustrates a simplified schematic diagram of an optical characterization system, in accordance with one or more embodiments of the present disclosure.

FIG. 13 illustrates a simplified schematic diagram of an optical characterization system 1300, in accordance with one or more embodiments of the present disclosure.

The optical characterization system 1300 may include any characterization system known in the art including, but not limited to, an inspection system, a review system, an image-based metrology system, and the like. In this regard, system 1300 may be configured to perform inspection, review, or image-based metrology on a sample 1307. The optical characterization system 1300 may include, but is not limited to, multi-electron beam apparatus 300, a sample 1307 disposed on a sample stage 1312, a detector assembly 1314, and a controller 1318 including one or more processors 1320 and a memory 1322.

In one embodiment, the electron beam apparatus 300 of system 1300 is configured to direct the primary electron beamlets 305 to the sample 1307. The multi-electron beam apparatus 300 may form an electron-optical column. In another embodiment, multi-electron beam apparatus 300 includes one or more additional and/or alternative electron-optical elements configured to focus and/or direct the primary electron beamlets 305 to the surface of the sample 1307. In another embodiment, system 1300 includes one or more electron-optical elements 1310 configured to collect secondary electrons 1305 emanated from the surface of the sample 1307 in response to the primary electron beamlets 305. It is noted herein that the one or more electron-optical elements of multi-electron beam apparatus 300 and the one or more electron-optical elements 1310 may include any electron-optical elements configured to direct, focus, and/or collect electrons including, but not limited to, one or more deflectors, one or more electron-optical lenses, one or more condenser lenses (e.g., magnetic condenser lenses), one or more objective lenses (e.g., magnetic condenser lenses), and the like.

Sample 1307 may include any sample known in the art including, but not limited to, a wafer, a reticle, a photomask, and the like. In one embodiment, sample 1307 is disposed on a stage assembly 1312 to facilitate movement of sample 1307. In another embodiment, the stage assembly 1312 is an actuatable stage. For example, the stage assembly 1312 may include, but is not limited to, one or more translational stages suitable for selectably translating the sample 1307 along one or more linear directions (e.g., x-direction, y-direction and/or z-direction). By way of another example, the stage assembly 1312 may include, but is not limited to, one or more rotational stages suitable for selectively rotating the sample 1307 along a rotational direction. By way of another example, the stage assembly 1312 may include, but is not limited to, a rotational stage and a translational stage suitable for selectably translating the sample 1307 along a linear direction and/or rotating the sample 1307 along a rotational direction. It is noted herein that the system 1300 may operate in any scanning mode known in the art.

It is noted that the electron optical assembly of the multi-electron beam apparatus 300 and/or system 1300 is not limited to the electron-optical elements depicted in FIG. 13, which are provided merely for illustrative purposes. It is further noted that the system 1300 may include any number and type of electron-optical elements necessary to direct/focus the primary electron beamlets 305 onto the sample 1307 and, in response, collect and image the emanated secondary electrons 1305 onto the detector assembly 1314.

For example, the system 1300 may include one or more electron beam scanning elements (not shown). For instance, the one or more electron beam scanning elements may include, but are not limited to, one or more electromagnetic scanning coils or electrostatic deflectors suitable for controlling a position of the primary electron beamlets 305 relative to the surface of the sample 1307. Further, the one or more scanning elements may be utilized to scan the primary electron beamlets 305 across the sample 1307 in a selected pattern.

In another embodiment, secondary electrons 1305 are directed by deflectors 317 to one or more sensors 1316 of a detector assembly 1314. The deflectors 317 may include any optical elements known in the art for directing secondary electrons 1305 including, but not limited to, Wien filters. The detector assembly 1314 of the system 1300 may include any detector assembly known in the art suitable for detecting multiple secondary electrons 1305 from the surface of the sample 1307. In one embodiment, the detector assembly 1314 includes an electron detector array. In this regard, the detector assembly 1314 may include an array of electron-detecting portions. Further, each electron-detecting portion of the detector array of the detector assembly 1314 may be positioned so as to detect an electron signal from sample 1307 associated with one of the incident primary electron beamlets 305. In this regard, each channel of the detector assembly 1314 may correspond to a particular primary electron beamlet 305 of the multi-electron beam apparatus 300. The detector assembly 1314 may include any type of electron detector known in the art. For example, the detector assembly 1314 may include a micro-channel plate (MCP), a PIN or p-n junction detector array, such as, but not limited to, a diode array or avalanche photo diodes (APDs). By way of another example, the detector assembly 1314 may include a high-speed scintillator/PMT detector.

While FIG. 13 illustrates the system 1300 as including a detector assembly 1314 comprising only a secondary electron detector assembly, this is not to be regarded as a limitation of the present disclosure. In this regard, it is noted that the detector assembly 1314 may include, but is not limited to, a secondary electron detector, a backscattered electron detector, and/or a primary electron detector (e.g., an in-column electron detector). In another embodiment, system 1300 may include a plurality of detector assemblies 1314. For example, system 1300 may include a secondary electron detector assembly 1314, a backscattered electron detector assembly 1314, and an in-column electron detector assembly 1314.

In another embodiment, detector assembly 1314 is communicatively coupled to a controller 1318 including one or more processors 1320 and memory 1322. For example, the one or more processors 1320 may be communicatively coupled to memory 1322, wherein the one or more processors 1320 are configured to execute a set of program instructions stored on memory 1322. In one embodiment, the one or more processors 1320 are configured to analyze the output of detector assembly 1314. In one embodiment, the set of program instructions are configured to cause the one or more processors 1320 to analyze one or more characteristics of sample 1307. In another embodiment, the set of program instructions are configured to cause the one or more processors 1320 to modify one or more characteristics of system 1300 in order to maintain focus on the sample 1307 and/or the sensor 1316. For example, the one or more processors 1320 may be configured to adjust one or more characteristics of the multi-electron beam apparatus 300, objective lens 1306, or one or more optical elements 1302 in order to focus primary electron beamlets 305 from multi-electron beam apparatus 300 onto the surface of the sample 1307. By way of another example, the one or more processors 1320 may be configured to adjust the objective lens 1306 and/or one or more optical elements 1310 in order to collect secondary electrons 1305 from the surface of the sample 1307 and focus the collected secondary electrons 1305 on the sensor 1316. By way of another example, the one or more processors 1320 may be configured to adjust one or more focusing voltages applied to one or more electrostatic deflectors of multi-electron beam apparatus 300 in order to independently adjust the position or alignment of one or more primary electron beamlets 305.

It is noted herein that the one or more components of system 1300 may be communicatively coupled to the various other components of system 1300 in any manner known in the art. For example, the one or more processors 1320 may be communicatively coupled to each other and other components via a wireline (e.g., copper wire, fiber optic cable, and the like) or wireless connection (e.g., RF coupling, IR coupling, data network communication (e.g., WiFi, WiMax, Bluetooth and the like). By way of another example, the one or more processors may be communicatively coupled to one or more components of the multi-electron beam apparatus 300 (e.g., electron source 302, MLA 308, MSA 310, and the like), the one or more voltage sources, and the like In one embodiment, the one or more processors 1320 may include any one or more processing elements known in the art. In this sense, the one or more processors 1320 may include any microprocessor-type device configured to execute software algorithms and/or instructions. In one embodiment, the one or more processors 1320 may consist of a desktop computer, mainframe computer system, workstation, image computer, parallel processor, or other computer system (e.g., networked computer) configured to execute a program configured to operate the system 1300, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 1320. In general, the term "processor" may be broadly defined to encompass any device having one or more processing elements, which execute program instructions from memory 1322. Moreover, different subsystems of the system 1300 (e.g., multi-electron beam apparatus 300, MLA 308, MSA 310, detector assembly 1314, controller 1318, and the like) may include processor or logic elements suitable for carrying out at least a portion of the steps described throughout the present disclosure. Therefore, the above description should not be interpreted as a limitation on the present disclosure but merely an illustration.

The memory 1322 may include any storage medium known in the art suitable for storing program instructions executable by the associated one or more processors 1320. For example, the memory 1322 may include a non-transitory memory medium. For instance, the memory 1322 may include, but is not limited to, a read-only memory (ROM), a random access memory (RAM), a magnetic or optical memory device (e.g., disk), a magnetic tape, a solid state drive and the like. It is further noted that memory 1322 may be housed in a common controller housing with the one or more processors 1320. In an alternative embodiment, the memory 1322 may be located remotely with respect to the physical location of the processors 1320, controller 1318, and the like. In another embodiment, the memory 1322 maintains program instructions for causing the one or more processors 1320 to carry out the various steps described through the present disclosure.

Figure 14:
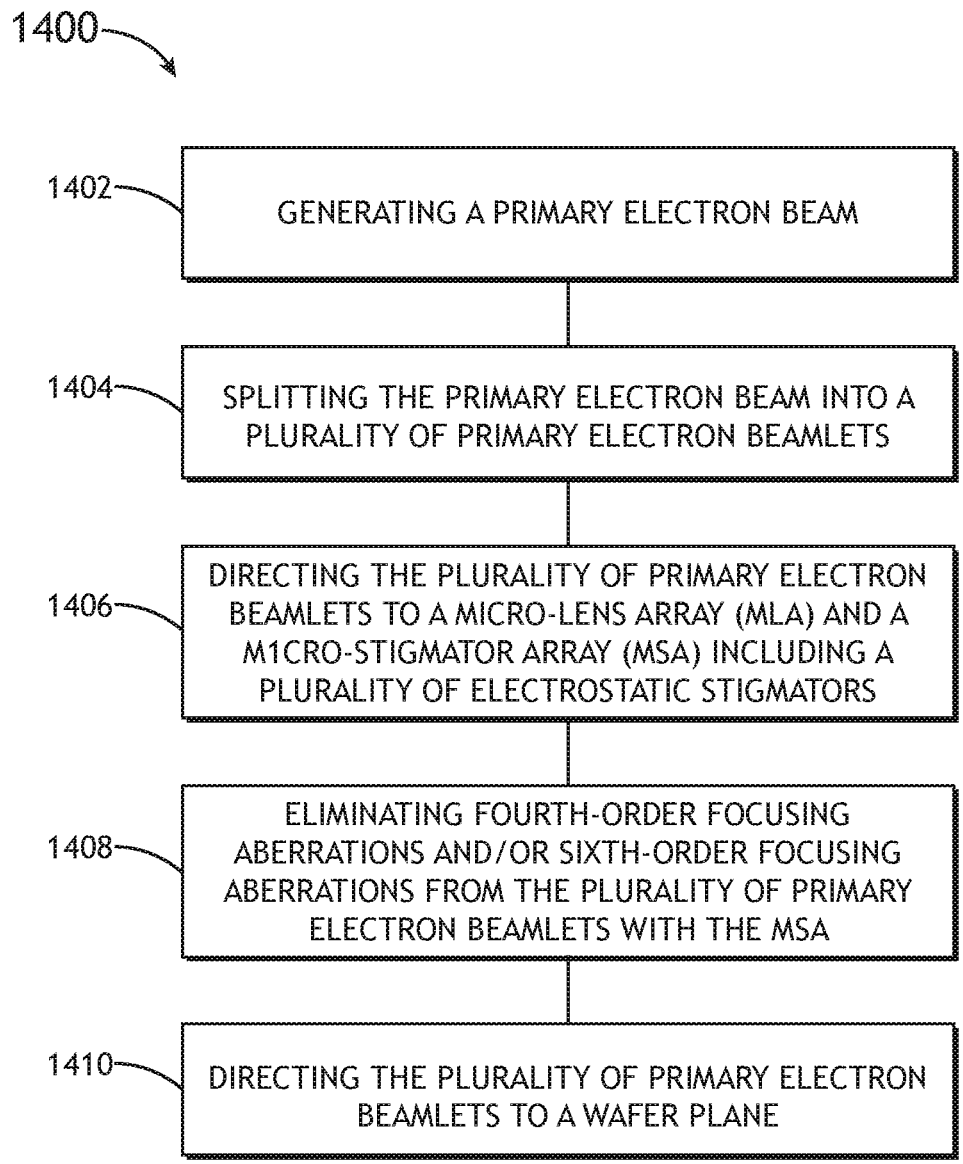
FIG. 14 illustrates a flowchart of a method of inspection using a multi lens array, in accordance with one or more embodiments of the present disclosure.

FIG. 14 illustrates a flowchart of a method 1400 of inspection using a multi-stigmator array 310 (MSA 310), in accordance with one or more embodiments of the present disclosure. It is noted herein that the steps of method 1400 may be implemented all or in part by system 1300 and/or multi-electron beam apparatus 300. It is further recognized, however, that the method 1400 is not limited to the system 1300 and/or multi-electron beam apparatus 300 in that additional or alternative system-level embodiments may carry out all or part of the steps of method 1400.

In a step 1402, a primary electron beam is generated. For example, an electron source 302 may generate a primary electron beam 303. The electron source 302 may include any electron source known in the art including, but not limited to, thermal field emission (TFE) sources.

In a step 1404, the primary electron beam is split into a plurality of primary electron beamlets. For example, as shown in FIG. 3, the MAA 306 may be configured to receive the primary electron beam 303 and split the primary electron beam 303 in to a plurality of primary electron beamlets 305.

In a step 1406, the plurality of primary electron beamlets are directed to a micro-lens array 308 (MLA 308) and a micro-stigmator array 310 (MSA 310). In embodiments, the MLA 308 may include a plurality of micro-lenses 334a-334n. Similarly, the MSA 310 may include a plurality of electrostatic stigmators. For example, the MSA 310 may include a plurality of dodecapole electrostatic stigmators 320. By way of another example, the MSA 310 may include a plurality of full-square quadrupole electrostatic stigmators 350, rectangular-shaped quadrupole electrostatic stigmators, and/or quadrupole electrostatic stigmators with hyperbolic protrusions.

In a step 1408, fourth-order focusing aberrations and/or sixth-order focusing aberrations are eliminated from the plurality of electron beamlets with the MSA. For example, each dodecapole electrostatic stigmator 320 of the MSA 310 may be configured to receive a single primary electron beamlet 305 and eliminate fourth-order focusing aberrations and/or sixth-order focusing aberrations from the primary electron beamlet 305. In embodiments, a controller may be configured to cause one or more voltage sources to selectively adjust focusing voltages applied to the electrostatic stigmators of the MSA 310 in order to reduce and/or eliminate focusing aberrations.

In a step 1410, the plurality of primary electron beamlets are directed to a wafer plane. For example, projection optics of the multi-electron beam apparatus 300 may be configured to direct primary electron beamlets 305 to a wafer plane 318. The projection optics may include, but are not limited to, a transfer lens 314 and an objective lens 316. In embodiments, the plurality of electron beamlets 305 may be directed to a sample 1307 in order to carry out one or more characterization processes of the sample 1307.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system, comprising:
    an electron source;
    a micro-lens array (MLA) configured to receive one or more primary electron beams from the electron source and split the one or more primary electron beams into a plurality of primary electron beamlets;
    a micro-stigmator array (MSA) comprising a plurality of dodecapole electrostatic stigmators, wherein the MSA is configured to eliminate at least one of fourth-order focusing aberrations or sixth-order focusing aberrations of the plurality of primary electron beamlets; and
    projection optics configured to receive the plurality of primary electron beamlets and focus the plurality of primary electron beamlets onto a surface of a sample.

2. The system of claim 1, wherein the micro-stigmator array (MSA) comprises:
    an insulator substrate;
    a plurality of dodecapole electrostatic stigmators disposed on the insulator substrate, wherein each dodecapole electrostatic stigmator of the plurality of dodecapole electrostatic stigmators comprises twelve conductive plates; and
    a plurality of voltage connecting lines disposed on the insulator substrate configured to electrically couple the plurality of dodecapole electrostatic stigmators to one or more voltage sources via a plurality of connecting pins, wherein the one or more voltage sources are configured to apply one or more focusing voltages to each dodecapole electrostatic stigmator of the plurality of dodecapole electrostatic stigmators.

3. The system of claim 2, wherein each dodecapole electrostatic stigmator of the plurality of dodecapole electrostatic stigmators is coupled to the one or more voltage sources with a single voltage connecting line.

4. The system of claim 1, further comprising a controller including one or more processors and a memory, wherein the one or more processors are configured to adjust the one or more focusing voltages applied to each dodecapole electrostatic stigmator of the plurality of dodecapole electrostatic stigmators.

5. The system of claim 4, wherein the one or more processors are further configured to selectively adjust the one or more focusing voltages in order to selectively remove an octupole field and a dodecapole field of each primary electron beamlet of the plurality of primary electron beamlets.

6. The system of claim 4, wherein the one or more processors are further configured to adjust the one or more focusing voltages in order to individually adjust a position of each primary electron beamlet of the plurality of primary electron beamlets at a wafer plane.

7. The system of claim 1, further comprising a beam-limiting aperture (BLA) configured to receive the primary electron beam from the electron source and direct the primary electron beam to the micro-lens array (MLA).

8. The system of claim 1, wherein the projection optics comprise a transfer lens and an objective lens.

9. The system of claim 1, wherein the electron source comprises a thermal field emission (TFE) source.

10. The system of claim 1,
wherein a first conductive plate, a third conductive plate, a fifth conductive plate, a seventh conductive plate, a ninth conductive plate, and an eleventh conductive plate of each dodecapole electrostatic stigmator of the plurality of dodecapole electrostatic stigmators are applied with a first focusing voltage.

11. The system of claim 10, wherein a second conductive plate, a fourth conductive plate, a sixth conductive plate, an eighth conductive plate, a tenth conductive plate, and a twelfth conductive plate are applied with a second focusing voltage.

12. The system of claim 11, wherein the second focusing voltage comprises zero volts (0V).

13. The system of claim 1,
wherein each dodecapole electrostatic stigmator of the plurality of dodecapole electrostatic stigmators comprises twelve conductive plates,
wherein each conductive plate of the twelve conductive plates is separated by a gap angle $\delta$,
wherein a first conductive plate, a fourth conductive plate, a seventh conductive plate, and a tenth conductive plate are defined by a plate angle $2\alpha$, and
wherein a second conductive plate, a third conductive plate, a fifth conductive plate, a sixth conductive plate, an eighth conductive plate, a ninth conductive plate, an eleventh conductive plate, and a twelfth conductive plate are defined by a plate angle $\beta$, such that $\beta=45°-\alpha-(3\delta/2)$.

14. A micro-stigmator array (MSA), comprising:
an insulator substrate;
a plurality of electrostatic stigmators disposed on the insulator substrate, the plurality of electrostatic stigmators configured to receive a plurality of primary electron beamlets and eliminate at least one of fourth-order focusing aberrations or sixth-order focusing aberrations of the plurality of primary electron beamlets; and
a plurality of voltage connecting lines disposed on the insulator substrate configured to electrically couple the plurality of electrostatic stigmators to one or more voltage sources via a plurality of connecting pins, wherein the one or more voltage sources are configured to apply one or more focusing voltages to each electrostatic stigmator of the plurality of electrostatic stigmators.

15. The micro-stigmator array of claim 14, wherein the micro-stigmator array is configured to selectively remove an octupole field and a dodecapole field of each primary electron beamlet of the plurality of primary electron beamlets.

16. The micro-stigmator array of claim 14, wherein the plurality of electrostatic stigmators comprise a plurality of dodecapole electrostatic stigmators.

17. The micro-stigmator of claim 16,
wherein each dodecapole electrostatic stigmator of the plurality of dodecapole electrostatic stigmators comprises twelve conductive plates,
wherein each conductive plate of the twelve conductive plates is separated by a gap angle $\delta$,
wherein a first conductive plate, a fourth conductive plate, a seventh conductive plate, and a tenth conductive plate are defined by a plate angle $2\alpha$, and
wherein a second conductive plate, a third conductive plate, a fifth conductive plate, a sixth conductive plate, an eighth conductive plate, a ninth conductive plate, an eleventh conductive plate, and a twelfth conductive plate are defined by a plate angle $\beta$, such that $\beta=45°-\alpha-(3\delta/2)$.

18. The micro-stigmator array of claim 16, wherein a first conductive plate, a third conductive plate, a fifth conductive plate, a seventh conductive plate, a ninth conductive plate, and an eleventh conductive plate of each dodecapole electrostatic stigmator of the plurality of dodecapole electrostatic stigmators are applied with a first focusing voltage.

19. The micro-stigmator array of claim 18, wherein a second conductive plate, a fourth conductive plate, a sixth conductive plate, an eighth conductive plate, a tenth conductive plate, and a twelfth conductive plate are applied with a second focusing voltage.

20. The micro-stigmator array of claim 19, wherein the second focusing voltage comprises zero volts (0V).

21. The micro-stigmator array of claim 14, wherein the plurality of electrostatic stigmators comprise a plurality of full-square quadrupole electrostatic stigmators.

22. The micro-stigmator array of claim 14, wherein the plurality of electrostatic stigmators comprise a plurality of rectangular quadrupole electrostatic stigmators.

23. The micro-stigmator array of claim 14, wherein the plurality of electrostatic stigmators comprise a plurality of quadrupole electrostatic stigmators including four conductive plates, each conductive plate including a hyperbolic protrusion extending inwards toward an optical axis of each quadrupole electrostatic stigmator.

24. The micro-stigmator array of claim 14, wherein each electrostatic stigmator of the plurality of electrostatic stigmators is coupled to the one or more voltage sources with a single voltage connecting line.

25. A dodecapole electrostatic stigmator, comprising:
twelve conductive plates arranged about a radius R, the twelve conductive plates comprising a first conductive plate, a second conductive plate, a third conductive plate, a fourth conductive plate, a fifth conductive plate, a sixth conductive plate, a seventh conductive plate, an eighth conductive plate, a ninth conductive plate, a tenth conductive plate, an eleventh conductive plate, and a twelfth conductive plate, wherein the first conductive plate, the third conductive plate, the fifth conductive plate, the seventh conductive plate, the ninth conductive plate, and the eleventh conductive plate are applied with a first focusing voltage in order to eliminate at least one of fourth-order focusing aberrations or sixth-order focusing aberrations of the primary electron beamlet.

26. The dodecapole electrostatic stigmator of claim 25, the second conductive plate, the fourth conductive plate, the sixth conductive plate, the eighth conductive plate, the tenth conductive plate, and the twelfth conductive plate are applied with a second focusing voltage.

27. The dodecapole electrostatic stigmator of claim 26, wherein the second focusing voltage comprises 0V.

28. The dodecapole electrostatic stigmator of claim 25, further comprising an insulator substrate, wherein the twelve conductive plates are disposed on the insulator substrate.

29. The dodecapole electrostatic stigmator of claim 25, wherein each conductive plate of the twelve deflection plates is separated by a gap angle $\delta$, wherein a first conductive plate, a fourth conductive plate, a seventh conductive plate, and a tenth conductive plate are defined by a plate angle $2\alpha$, and wherein a second conductive plate, a third conductive plate, a fifth conductive plate, a sixth conductive plate, an eighth conductive plate, a ninth conductive plate, an eleventh conductive plate, and a twelfth conductive plate are defined by a plate angle $\beta$, such that $\beta=45°-\alpha-(3\delta/2)$.

30. The dodecapole electrostatic stigmator of claim 25, further comprising one or more voltage connecting lines configured to electrically couple the first conductive plate, the third conductive plate, the fifth conductive plate, the seventh conductive plate, the ninth conductive plate, and the eleventh conductive plate to one or more voltage sources.

* * * * *